(12) United States Patent
Chen et al.

(10) Patent No.: US 12,057,154 B2
(45) Date of Patent: Aug. 6, 2024

(54) METHOD FOR EFFICIENTLY WAKING UP FERROELECTRIC MEMORY

(71) Applicant: TAIWAN SEMICONDUCTOR MANUFACTURING COMPANY, LTD., Hsinchu (TW)

(72) Inventors: Tzu-Yu Chen, Hsinchu (TW); Sheng-Hung Shih, Hsinchu (TW); Fu-Chen Chang, Hsinchu (TW); Kuo-Chi Tu, Hsinchu (TW); Wen-Ting Chu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 158 days.

(21) Appl. No.: 17/370,144

(22) Filed: Jul. 8, 2021

(65) Prior Publication Data

US 2023/0011895 A1    Jan. 12, 2023

(51) Int. Cl.
*G11C 11/22* (2006.01)
*G11C 7/20* (2006.01)

(52) U.S. Cl.
CPC .............. *G11C 11/221* (2013.01); *G11C 7/20* (2013.01)

(58) Field of Classification Search
CPC ................................ G11C 11/221; G11C 7/20
See application file for complete search history.

(56) References Cited

U.S. PATENT DOCUMENTS

| | | | |
|---|---|---|---|
| 5,740,100 A * | 4/1998 | Yoo | G11C 11/22 365/145 |
| 10,153,054 B2 * | 12/2018 | Mariani | G11C 11/2275 |
| 2010/0025747 A1 * | 2/2010 | Fukada | G11C 11/22 257/295 |

* cited by examiner

*Primary Examiner* — Vanthu T Nguyen
(74) *Attorney, Agent, or Firm* — Birch, Stewart, Kolasch & Birch, LLP

(57) ABSTRACT

A method for efficiently waking up ferroelectric memory is provided. A wafer is formed with a plurality of first signal lines, a plurality of second signal lines, a plurality of third signal lines, and a plurality of ferroelectric memory cells that constitute a ferroelectric memory array. Each of the ferroelectric memory cells is electrically connected to one of the first signal lines, one of the second signal lines and one of the third signal lines. Voltage signals are simultaneously applied to the first signal lines, the second signal lines and the third signal lines to induce occurrence of a wake-up effect in the ferroelectric memory cells.

20 Claims, 26 Drawing Sheets

METHOD FOR EFFICIENTLY WAKING UP FERROELECTRIC MEMORY

BACKGROUND

Non-volatile memory is widely used in electronic devices to store data. Ferroelectric random access memory (FeRAM), which has a relatively simple structure and is compatible with complementary metal-oxide-semiconductor (CMOS) logic fabrication processes, is a candidate for the next generation of non-volatile memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
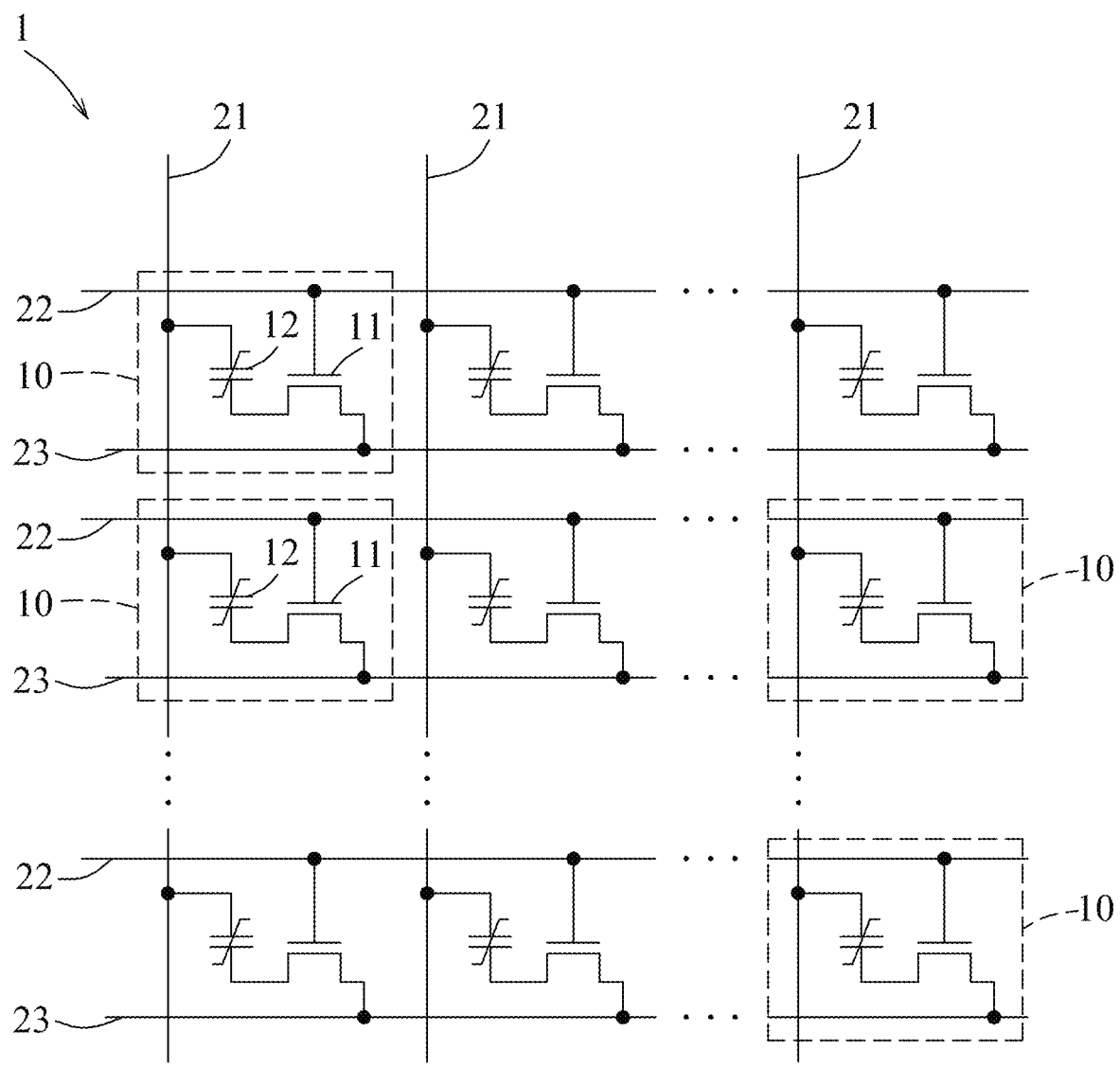
FIG. 1 is a schematic circuit diagram illustrating a FeRAM array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "up," "down," "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a FeRAM array 1 is shown to include a plurality of FeRAM cells 10 in accordance with some embodiments. The FeRAM cells 10 are defined by a plurality of bit lines 21 that extend in a first direction, a plurality of word lines 22 that extend in a second direction transverse to the first direction, and a plurality of plate lines 23 that extend in the second direction. The bit lines 21, the word line 22 and the plate lines 23 are signal lines configured for transmission of electric signal, and can be made of, for example, aluminum, copper, some other conductive materials, and any combination thereof. Each of the FeRAM cells 10 is electrically connected to one of the bit lines 21, one of the word lines 22 and one of the plate lines 23, and includes an access transistor 11 and a ferroelectric capacitor 12. In some embodiments, the access transistor 11 may be a metal-oxide-semiconductor field-effect transistor (MOSFET), a bipolar junction transistor (BJT), a fin field-effect transistor (FinFET), any other suitable insulated-gate field-effect transistors (IGFETs), or any other suitable transistors. In some embodiments, the ferroelectric capacitor 12 may have a metal-ferroelectric-metal structure that includes a ferroelectric structure sandwiched between two metal layers (e.g., a top electrode and a bottom electrode), and may be connected to at least one terminal of the access transistor 11. For example, in a case that the access transistor 11 is an MOSFET, the ferroelectric capacitor 12 may be connected to a gate electrode, a drain region or a source region of the access transistor 11 according to circuit design. In some embodiments, one of the electrodes of the ferroelectric capacitor 12 may be connected to one of the terminals of the access transistor 11, and the other one of the electrodes of the ferroelectric capacitor 12 may be connected to one of the bit line 21, the word line 22 and the plate line 23 that corresponds to the FeRAM cell 10. In the illustrative embodiment, the ferroelectric capacitor 12 of each FeRAM cell 10 is connected between a corresponding one of the bit lines 21 and a drain region of the access transistor 11. A gate electrode and a source region of the access transistor 11 of each FeRAM cell 10 are connected to a corresponding one of the word lines 22 and a corresponding one of the plate lines 23, respectively.

Figure 2:
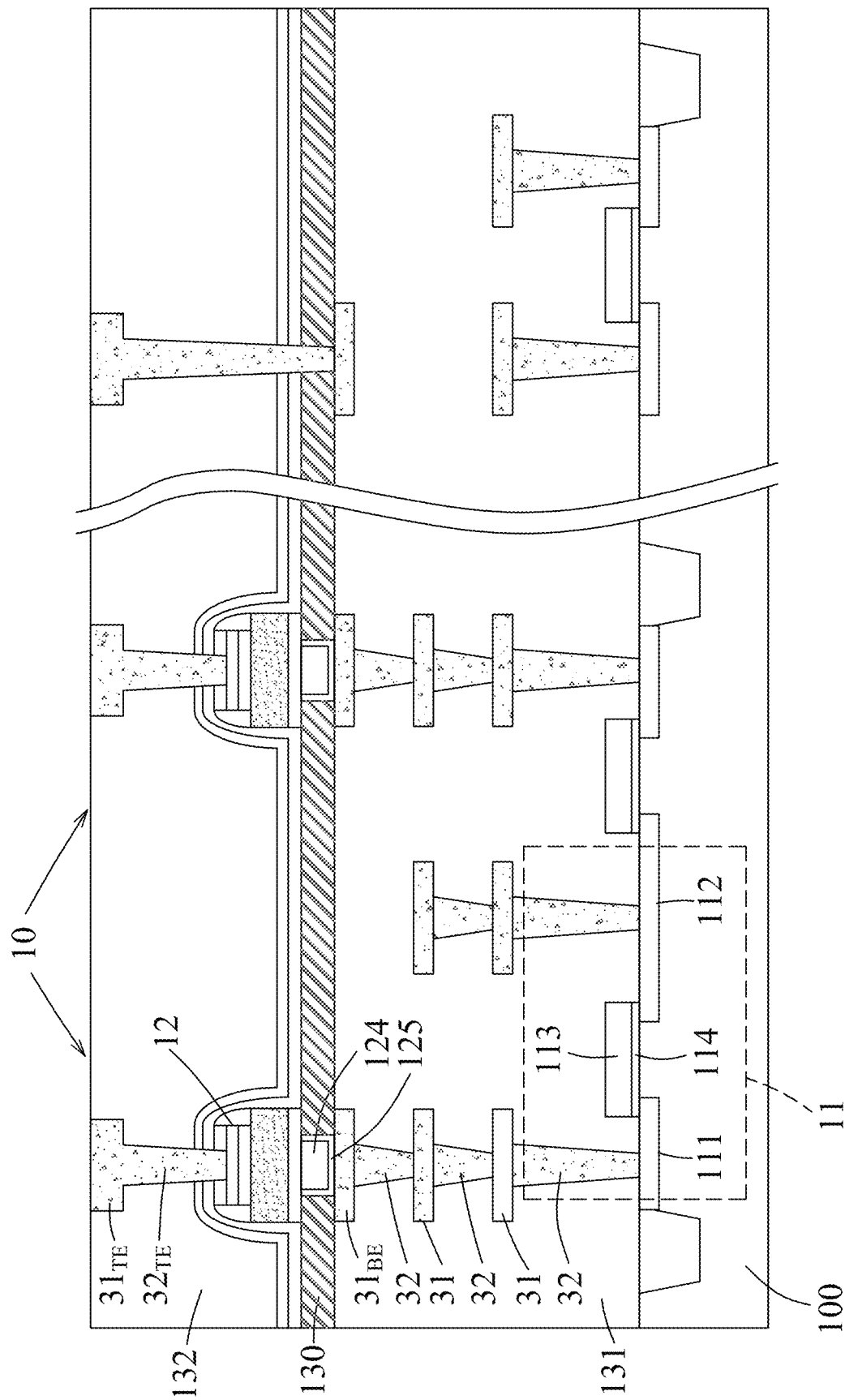
FIG. 2 is a schematic view illustrating a structure of a FeRAM cell in accordance with some embodiments.

FIG. 2 illustrates a sectional view of some embodiments of an integrated circuit (IC) where the FeRAM cells 10 are shown. In FIG. 2, the right part shows a logic region, and the left part shows a memory region in which the FeRAM cells 10 are located. Further referring to FIG. 3, which shows an enlarged view of the ferroelectric capacitor 12 in FIG. 2, the ferroelectric capacitor 12 is used to store a bit of data, and includes a top electrode 121, a bottom electrode 122, and a ferroelectric structure 123 that is sandwiched between the top electrode 121 and the bottom electrode 122. For example, atoms in the ferroelectric structure 123 may be polarized in one of an "up" direction and a "down" direction to represent a binary value of "1", or be polarized in the other one of the "up" direction and the "down" direction to represent a binary value of "0".

The top electrode 121 is disposed over the ferroelectric structure 123, and may include, for example, titanium nitride (TiN), tantalum nitride (TaN), titanium (Ti), tantalum (Ta), platinum (Pt), iridium (Ir), ruthenium (Ru), tungsten (W), silver (Ag), copper (Cu), nickel (Ni), some other suitable conductive materials, or any combination thereof. In some embodiments, the top electrode 121 may be homogeneous (e.g., the entire body of the top electrode 121 is made of a single material). In some embodiments, the top electrode 121 may be heterogeneous (e.g., the body of the top electrode 121 is made of multiple layers and/or materials). In the illustrative embodiment, the top electrode 121 is exemplified to include a first metal layer 121A and a second metal layer 121B, each of which can be made of one or more materials as listed above. The second metal layer 121B may be a buffer layer that prevents diffusion of metal components from a top electrode via $32_{TE}$ to the first metal layer 121A.

The bottom electrode 122 is disposed under the ferroelectric structure 123 and over a bottom electrode via 124 that is formed in a via dielectric layer 130. The via dielectric layer 130 may include, for example, silicon oxide, a low-k dielectric, some other suitable dielectrics, or any combination. The bottom electrode 122 and the bottom electrode via 124 may include, for example, titanium nitride (TiN), tantalum nitride (TaN), titanium (Ti), tantalum (Ta), platinum (Pt), iridium (Ir), ruthenium (Ru), tungsten (W), silver (Ag), copper (Cu), nickel (Ni), some other suitable conductive materials, or any combination thereof. In some embodiments, the bottom electrode 122 and the bottom electrode via 124 may be homogeneous (e.g., the entire body of each of the bottom electrode 122 and the bottom electrode via 124 is made of a single material). In some embodiments, the bottom electrode 122 and the bottom electrode via 124 may be heterogeneous (e.g., the body of each of the bottom electrode 122 and the bottom electrode via 124 is made of multiple layers and/or materials). The bottom electrode 122 and the bottom electrode via 124 may be of either the same material(s) or different materials. In some embodiments, a buffer layer 125 may be formed between the bottom electrode via 124 and the via dielectric layer 130 and between the bottom electrode via 124 and a bottom electrode wire $31_{BE}$ in order to prevent diffusion of metal components from the bottom electrode wire $31_{BE}$ to the bottom electrode 122 and the via dielectric layer 130. The bottom electrode 122 is electrically coupled to a drain region 111 of the access transistor 11 through the bottom electrode wire $31_{BE}$, multiple wires 31 and multiple vias 32 that are formed in a lower interconnect dielectric layer 131. The bottom electrode wire $31_{BE}$, the wires 31 and the vias 32 may include, for example, aluminum copper, copper (Cu), aluminum (Al), some other suitable conductive materials, or any combination thereof. The lower interconnect dielectric layer 131 may include, for example, silicon dioxide, silicon oxynitride, a low-k dielectric, silicon carbide, silicon nitride, some other suitable dielectric(s), or any combination thereof.

The ferroelectric structure 123 is disposed between the top electrode 121 and the bottom electrode 122, and may include, for example, strontium bismuth tantalite (SBT), lead zirconate titanate (PZT), hafnium zirconium oxide (HZO), doped hafnium oxide, some other suitable ferroelectric material(s), or any combination thereof. The dopant for the doped hafnium oxide may include, for example, zirconium (Zr), silicon (Si), yttrium (Y), aluminum (Al), gadolinium (Gd), lanthanum (La), strontium (Sr), some other suitable elements, or any combination thereof.

In some embodiments, a mask layer 133A is disposed over the top electrode 121, and two spacers 133B are formed at two opposite sides of a stack that includes the top electrode 121 and the mask layer 133A. The mask layer 133A may include, for example, titanium nitride, silicon oxide, silicon nitride, silicon carbide nitride, silicon oxide nitride, metal oxide (e.g., titanium oxide, aluminum oxide or the like), some other suitable materials, or any combination thereof. The spacers 133B may include, for example, silicon nitride, silicon oxide, silicon oxynitride, some other suitable materials, or any combination thereof.

In some embodiments, an etch stop layer 134 is conformally formed on the mask layer 133A, the spacers 133B, sidewalls of the ferroelectric structure 123, sidewalls of the bottom electrode 122, and the via dielectric layer 130. The etch stop layer 134 may include, for example, silicon carbide, some other suitable materials, or any combination thereof.

In some embodiments, a buffer layer 135 is conformally formed on the etch stop layer 134 for releasing stress between the etch stop layer 134 and an upper interconnect layer 132 formed thereon. The buffer layer 135 may include, for example, silicon oxide, some other suitable materials, or any combination thereof. The upper interconnect dielectric layer 132 may include, for example, silicon dioxide, silicon oxynitride, a low-k dielectric, silicon carbide, silicon nitride, some other suitable dielectric(s), or any combination thereof.

Figure 3:
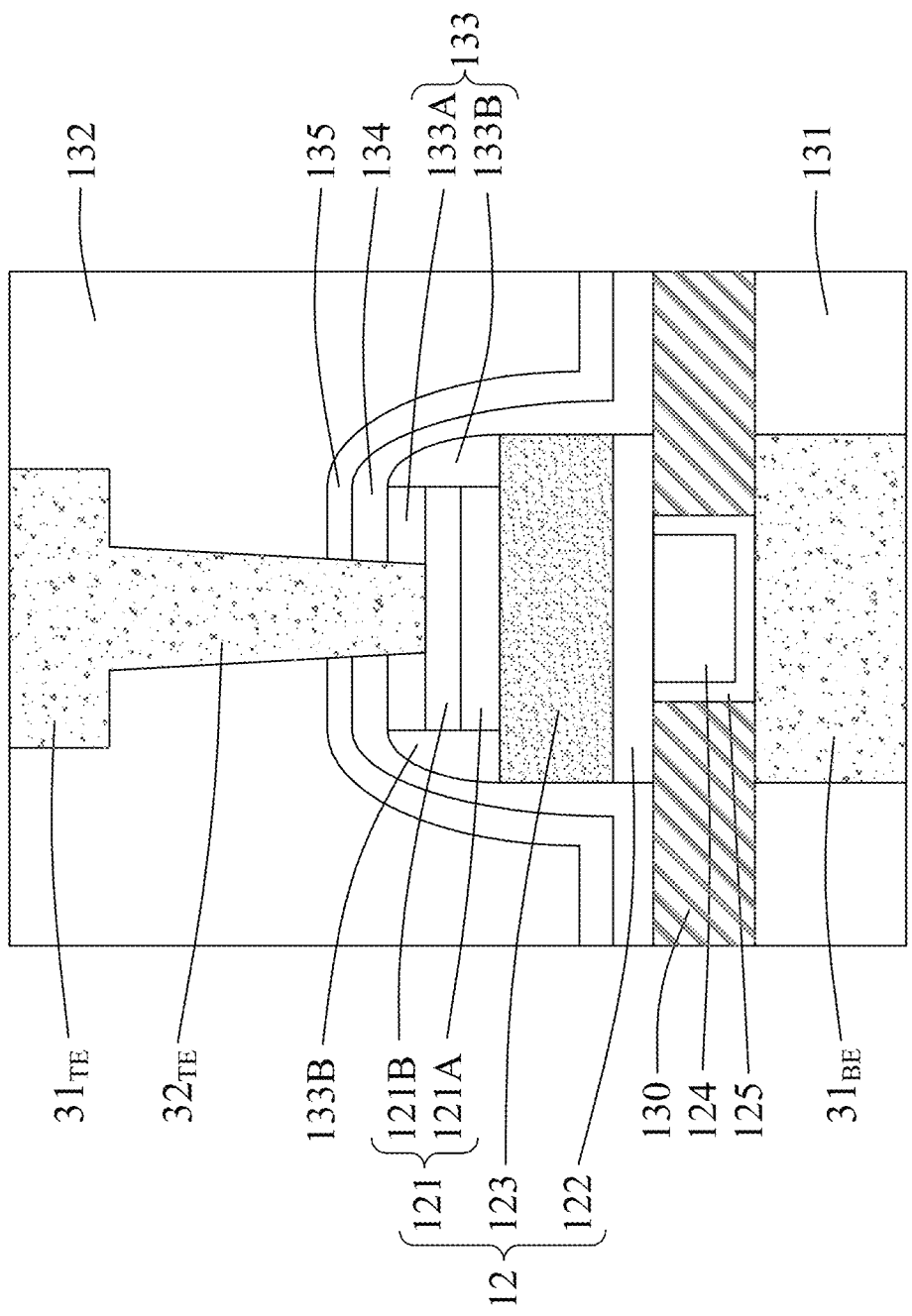
FIG. 3 is a schematic view illustrating a structure of a ferroelectric capacitor in accordance with some embodiments.

It is noted that the ferroelectric capacitor 12 and its surrounding structure (e.g., the mask layer 133A, the spaces 133B, the etch stop layer 134, and/or the buffer layer 135) of this disclosure are not limited to those illustrated in FIG. 3. Other structures that can be used to form a ferroelectric capacitor may also be applicable to this disclosure, as long as the ferroelectric capacitor includes a pair of electrodes, and a ferroelectric structure disposed between the two electrodes.

A top electrode wire $31_{TE}$ and the top electrode via $32_{TE}$ are formed in the upper interconnect layer 132. The top electrode via $32_{TE}$ extends from the top electrode wire $31_{TE}$ to the top electrode 121, so as to establish electrical connection therebetween. The top electrode wire $31_{TE}$ and the top electrode via $32_{TE}$ may include, for example, aluminum copper, copper (Cu), aluminum (Al), some other suitable conductive materials, or any combination thereof. The top electrode wire $31_{TE}$ and the top electrode via $32_{TE}$ may be of either the same material(s) or different materials. In some embodiments, the top electrode wire $31_{TE}$ may be electrically connected to the corresponding bit line 21, but this disclosure is not limited to such.

The access transistor 11 overlies a semiconductor substrate 100 (e.g., a wafer), which may be or include, for example, a bulk monocrystalline silicon substrate, a silicon-on-insulator (SOI) substrate, or some other suitable semiconductor substrate. In the illustrative embodiment, the access transistor 11 includes the drain region 111, a source region 112, a gate electrode 113, and a gate dielectric layer 114. The drain region 111 and the source region 112 are formed in the semiconductor substrate 100 and laterally spaced apart from each other to form a channel region therebetween. The gate electrode 113 overlaps the drain region 111, the source region 112 and the channel region. The gate dielectric layer 114 is disposed between the gate electrode 113 and the drain region 111, between the gate electrode 113 and the source region 112, and between the gate electrode 113 and the channel region. The gate dielectric layer 114 may include, for example, silicon oxide, a high-k dielectric layer, some other suitable dielectrics, or any combination thereof. The gate electrode 113 may include, for example, doped polysilicon, metal, some other suitable conductive material(s), or any combination thereof.

Figure 4:
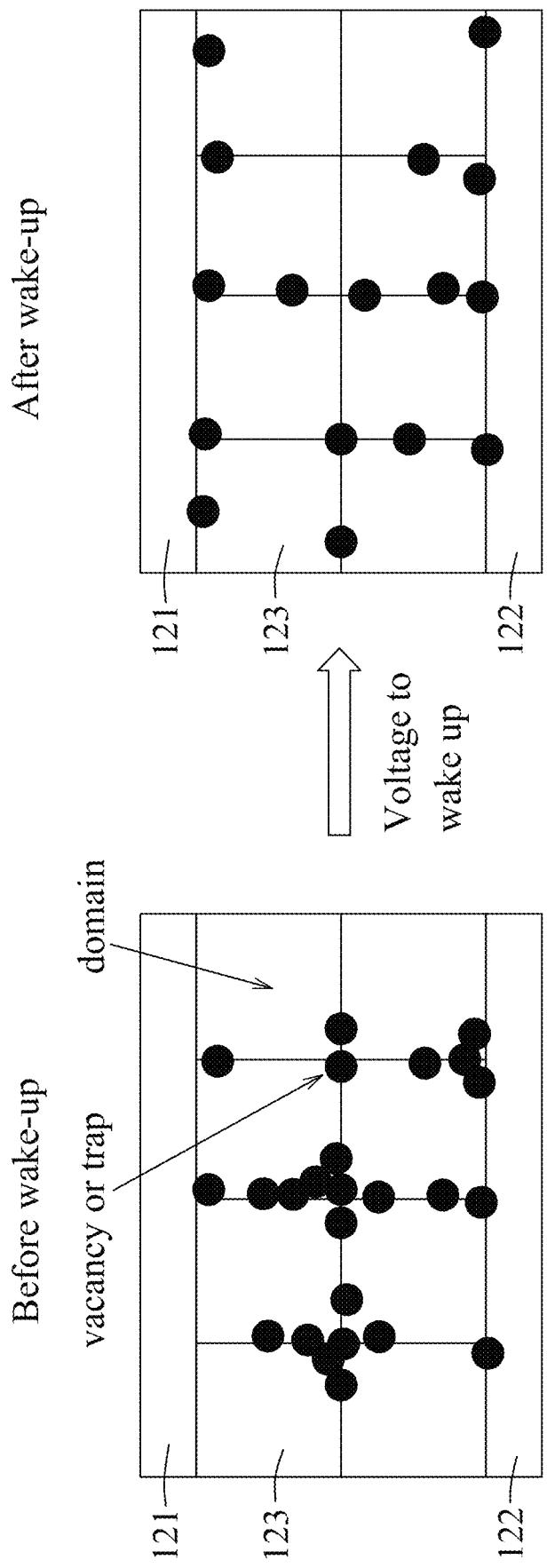
FIG. 4 is a schematic view illustrating a wake-up effect in the ferroelectric capacitor.
Figure 5:
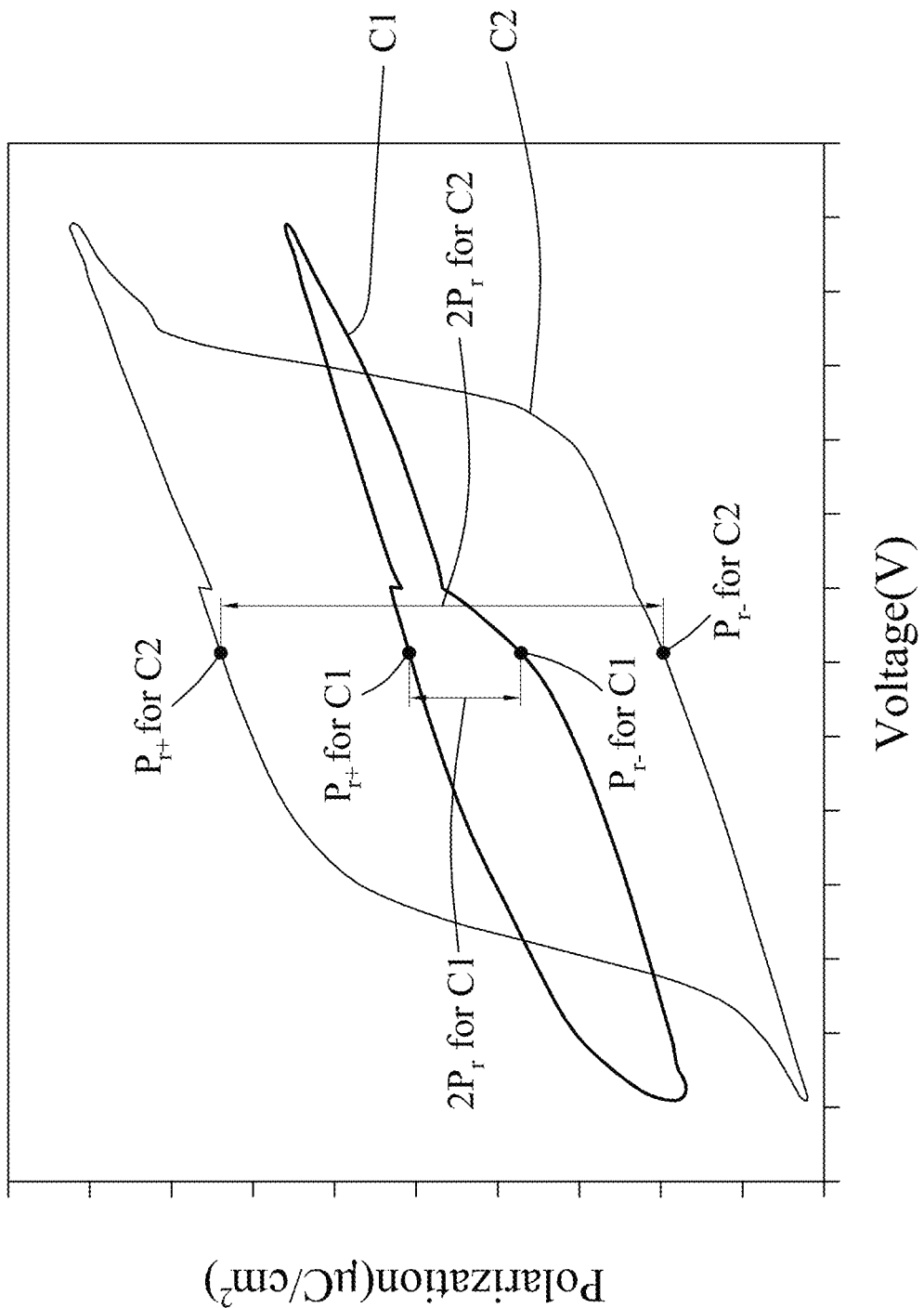
FIG. 5 is a plot illustrating a change in remnant polarization by wake-up operation.

The ferroelectric structure 123 of the ferroelectric capacitor 12 has electric dipoles whose polarizations are reversible by applying external electric field. FIG. 4 shows an exemplary ferroelectric domain in the ferroelectric structure 123 before and after applying the external electric field. Before applying the external electric field, a domain ping may be found in the ferroelectric structure 123 as shown in the left plot in FIG. 4. A domain ping refers to a cluster of vacancies or traps. The reversals of the dipoles around a domain ping may be obstructed, resulting in a small remnant polarization window (referred to as $2P_r$), as exemplified by a curve C1 in FIG. 5. However, when a voltage across the ferroelectric structure 123 is sufficiently large (referred to as wake-up voltage), a wake-up effect would be induced in the ferroelectric structure 123, making the vacancies/traps spread out, as shown in the right plot in FIG. 4, so phenomenon of the domain pings is alleviated, and the remnant polarization window can be enlarged (see the curve C2 in FIG. 5). In particular, the wake-up voltage should have a magnitude greater than a coercive voltage of the ferroelectric capacitor 12 (or more specifically, the ferroelectric structure 123) to make an electric field generated in the ferroelectric structure 123 greater than a coercive field of the ferroelectric structure 123, so as to induce the wake-up effect in the ferroelectric structure 123. It is noted that the sign of the wake-up voltage is not considered herein. For example, assuming that the coercive voltage of the ferroelectric capacitor 12 is 2 volts, either 5 volts or −5 volts is deemed greater than the coercive voltage and can be used as the wake-up voltage. In accordance with some embodiments, the wake-up voltage is applied such that the electric field generated in the ferroelectric structure 123 is in a range between about $2\times10^6$ volts/cm (i.e., 2 MV/cm) and about $6\times10^6$ volts/cm (i.e., 6 MV/cm). In accordance with some embodiments, a thickness of the ferroelectric structure 123 between the top electrode 121 and the bottom electrode 122 is in a range from about 5 nm to about 20 nm, so the corresponding wake-up voltage is in a range between about 1 volt and about 12 volts according to E=V/d, where E represents the electric field generated in the ferroelectric structure 123, V represents the voltage across the ferroelectric structure 123, and d represents the thickness of the ferroelectric structure 123. If the wake-up voltage is too large (e.g., making the electric field in the ferroelectric structure 123 greater than 6 MV/cm), dielectric breakdown may occur in the ferroelectric structure 123, resulting in permanent damage to the ferroelectric structure 123. If the wake-up voltage is too low (e.g., making the electric field in the ferroelectric structure 123 smaller than 2 MV/cm), the wake-up effect may not be induced.

In order to perform the wake-up operation effectively, the wake-up voltage can be applied to the ferroelectric capacitors 12 of the FeRAM cells 10 one array at a time, so the overall time required for waking up all the ferroelectric capacitors 12 that are formed on the semiconductor substrate 100 can be reduced. The array of the ferroelectric capacitors 12 that are woken up at the same time may correspond to, for example, a memory page (page wake-up), a memory block (block wake-up), a memory bank (bank wake-up), a memory sector (sector wake-up), or all (mass wake-up) of the FeRAM cells 10, and this disclosure is not limited in this respect.

In some implementations of the embodiment as illustrated in FIG. 1, the wake-up voltage can be applied to the ferroelectric capacitors 12 by applying a constant voltage of $V_{ref}$ to the word lines 22 and the plate lines 23 and applying a wake-up operation signal that has a voltage of ($V_{wk}+V_{ref}$) to the bit lines 21, where $V_{wk}$ is the wake-up voltage, so the voltage across the ferroelectric capacitors 12 that correspond to the bit lines 21, the word lines 22 and the plate lines 23 is substantially equal to $V_{wk}$, and the ferroelectric capacitors 12 are woken up. In a specific implementation, the word lines 22 and the plate lines 23 are applied with 0 volts (e.g., grounded), and a voltage of $V_{wk}$ is applied to the bit lines 21 at the same time to wake up the ferroelectric capacitors 12 that correspond to the bit lines 21, the word lines 22 and the plate lines 23. In accordance with some embodiments, it is not necessary for the voltage applied to the word lines 22 and the plate lines 23 to be constant, as long as the voltage across the ferroelectric capacitors 12 is sufficiently large (e.g., greater than the coercive voltage of the ferroelectric capacitors 12) to induce the wake-up effect in the ferroelectric capacitors 12.

In some implementations of the embodiment as illustrated in FIG. 1, the wake-up voltage can be applied to the ferroelectric capacitors 12 by applying the constant voltage of $V_{ref}$ to the plate lines 23, applying the wake-up operation signal that includes the voltage of ($V_{wk}+V_{ref}$) to the bit lines 21, and applying a turn-on voltage to the word lines 22 to turn on the access transistors 11 (e.g., making the access transistors 11 conduct), so the voltage across the ferroelectric capacitors 12 that correspond to the bit lines 21, the word lines 22 and the plate lines 23 is substantially equal to $V_{wk}$, and the ferroelectric capacitors 12 are woken up. In some other implementations, the wake-up voltage can be applied to the ferroelectric capacitors 12 by applying the constant voltage of $V_{ref}$ to the bit lines 21, applying the voltage of ($V_{wk}+V_{ref}$) to the plate lines 23, and applying the turn-on voltage to the word lines 22 to turn on the access transistors 11 (e.g., making the access transistors 11 conduct), so the voltage across the ferroelectric capacitors 12 that correspond to the bit lines 21, the word lines 22 and the plate lines 23 is substantially equal to $V_{wk}$, and the ferroelectric capacitors 12 are woken up.

Figure 6:
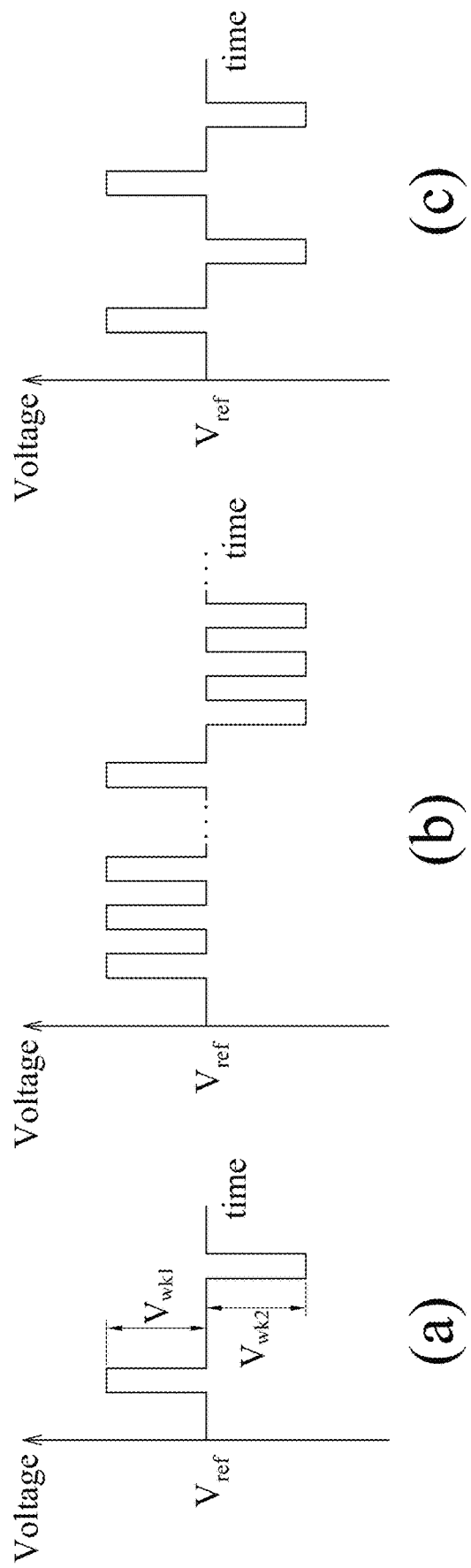
FIG. 6 exemplarily shows several waveforms that can be used in wake-up operation.

Referring to FIG. 6, part (a) illustrates that the wake-up operation may be performed using the wake-up operation signal that includes a single positive pulse and a single negative pulse for polarization in different directions, respectively. In accordance with some embodiments, the positive pulse and the negative pulse are symmetric with respect to $V_{ref}$ (e.g., the wake-up voltage ($V_{wk1}$) for the positive pulse and the wake-up voltage ($V_{wk2}$) for the negative pulse are the same in magnitude). For example, the positive pulse and the negative pulse can be of +3 volts and −3 volts (with respect to $V_{ref}$), respectively. In accordance with some embodiments, the positive pulse and the negative pulse are asymmetric with respect to $V_{ref}$ (e.g., the wake-up voltage ($V_{wk1}$) for the positive pulse and the wake-up voltage ($V_{wk2}$) for the negative pulse are different) for some technical purposes, such as the purpose of compensating for a difference between the work functions of the top electrode 121 and the bottom electrode 122, the purpose of making a positive remnant polarization value (referred to as $P_{r+}$) and a negative remnant polarization value (referred to as $P_r$) of the ferroelectric structure 123 asymmetric with respect to zero, and so on. For example, the positive pulse and the negative pulse can be of 5 volts and −3 volts with respect to $V_{ref}$, respectively. The greater the wake-up voltage, the greater the remnant polarization window.

Part (b) of FIG. 6 illustrates that the wake-up operation may be performed using the wake-up operation signal that is a periodic pulse signal and that includes periodic positive pulses and periodic negative pulses following the periodic positive pulses. Similarly, the positive pulses and the negative pulses can be either symmetric or asymmetric with respect to $V_{ref}$ for technical purposes. The periodic pulse signal may have a frequency in a range from about 100 Hz to about 100 MHz. If the frequency is too high (e.g., higher than 100 MHz), the wake-up effect may not be induced. If the frequency is too low (e.g., lower than 100 Hz), the wake-up operation may be less time-efficient.

Part (c) FIG. 6 illustrates that the wake-up operation may be performed using the wake-up operation signal that includes alternating positive and negative pulses. The positive pulses and the negative pulses can be either symmetric or asymmetric with respect to $V_{ref}$ for technical purposes. The pulses may have a frequency in a range from about 100 Hz to about 100 MHz. If the frequency is too high (e.g., higher than 100 MHz), the wake-up effect may not be induced. If the frequency is too low (e.g., lower than 100 Hz), the wake-up operation may be less time-efficient.

Figure 7:
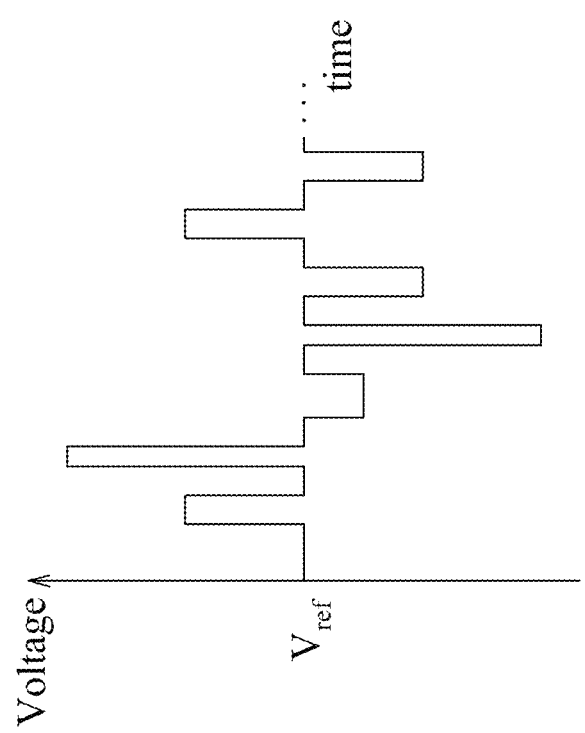
FIG. 7 exemplarily shows another waveform that can be used in wake-up operation.

FIG. 7 illustrates that the wake-up operation may be performed using the wake-up operation signal that is a combination of non-periodic positive and negative pulses. The pulses can have either the same or different voltage magnitudes, and can have either the same or different pulse widths. A time interval between two consecutive pulses may be in a range from about 10 ns to about 10 ms. If the time interval between two consecutive pulses is too short (e.g., shorter than 10 ns), the wake-up effect may not be induced. If the time interval between two consecutive pulses is too long (e.g., longer than 10 ms), the wake-up operation may be less time-efficient.

In the examples as illustrated in FIGS. 6 and 7, the pulse widths of the pulses may be in a range from about 5 ns to about 1 ms. In practice, a smaller wake-up voltage may be used in a pulse with a greater pulse width, so as to protect the ferroelectric structure 123 from damage. As an example, for two of the pulses in the wake-up operation signal, the pulse that has a wider pulse width may have a smaller voltage, but this disclosure is not limited in this respect.

In accordance with some embodiments, the wake-up operation may be performed using the wake-up operation signal that includes a set of positive direct current (DC) voltage and a negative DC voltage that are applied for a predetermined period of time.

In accordance with some embodiments, the wake-up operation may be performed using the wake-up operation signal that is an alternating current (AC) voltage signal, which can be of a sine wave, a triangular wave, a square wave, etc. The AC voltage signal may have a frequency in a range from about 100 Hz to about 100 MHz. If the frequency is too high (e.g., higher than 100 MHz), the wake-up effect may not be induced. If the frequency is too low (e.g., lower than 100 Hz), a period of applying the wake-up voltage to the ferroelectric structure 123 may be too long, which may reduce the reliability of the FeRAM cells 10.

Figure 8:
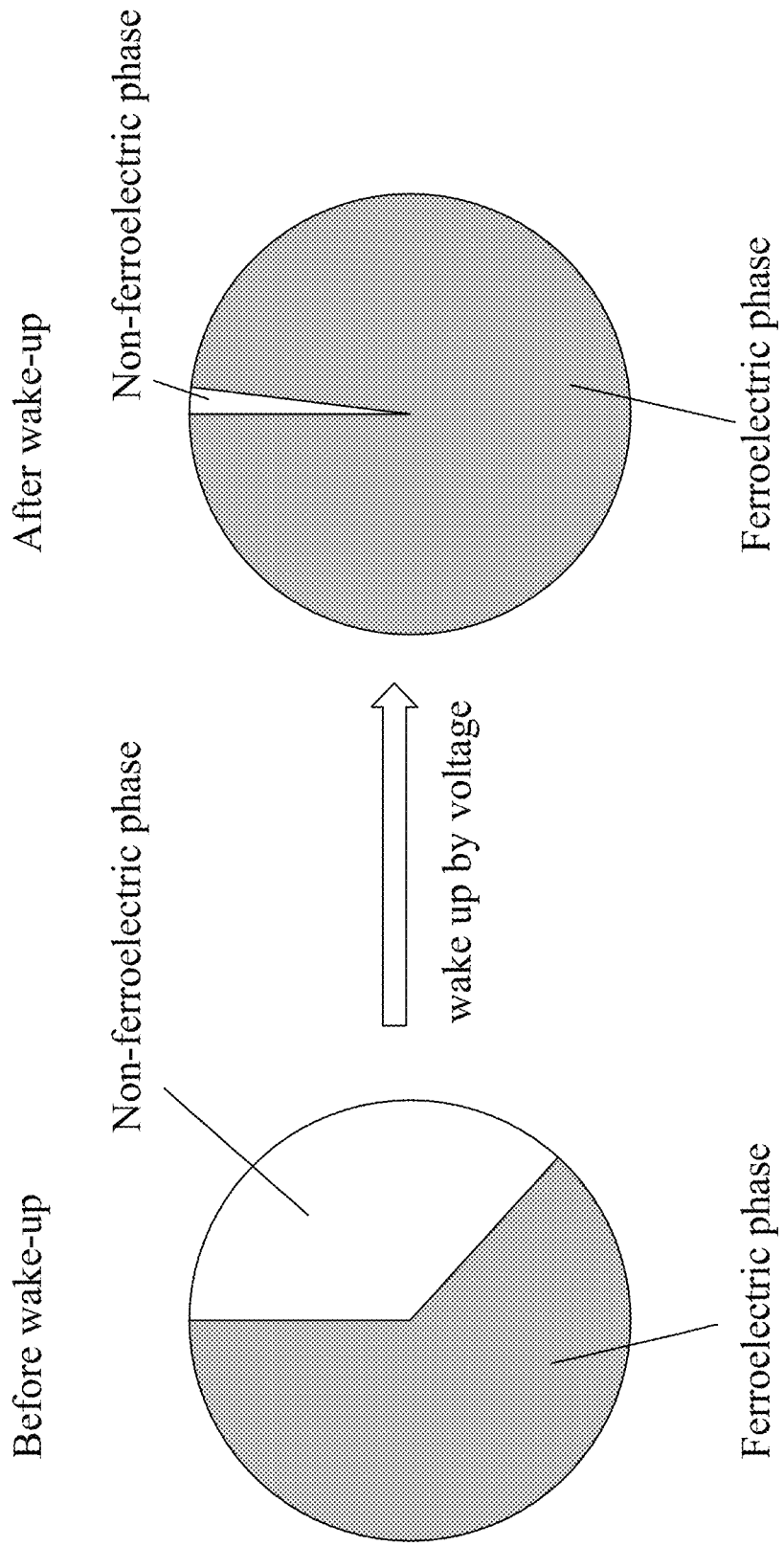
FIG. 8 is a schematic diagram illustrating a change in percentage of a ferroelectric phase in the ferroelectric capacitor by wake-up operation.

Referring to FIG. 8, a percentage of molecules of a ferroelectric phase in the ferroelectric structure 123 (referred to as ferroelectric-phase percentage herein) can be observed using electron back scatter diffraction (EBSD) and/or precession electron diffraction (PED) analysis. Before the wake-up operation, the ferroelectric-phase percentage may be in a range from about 40% to about 60%. After the wake-up operation, the ferroelectric-phase percentage may rise to be in a range from about 50% to about 100%. Different ferroelectric materials may have different ferroelectric phases. For example, the ferroelectric phase for HZO is the orthorhombic phase; the ferroelectric phase for $BaTiO_3$ is the tetragonal phase; and the ferroelectric phase for PZT is the monoclinic phase.

Figure 9:
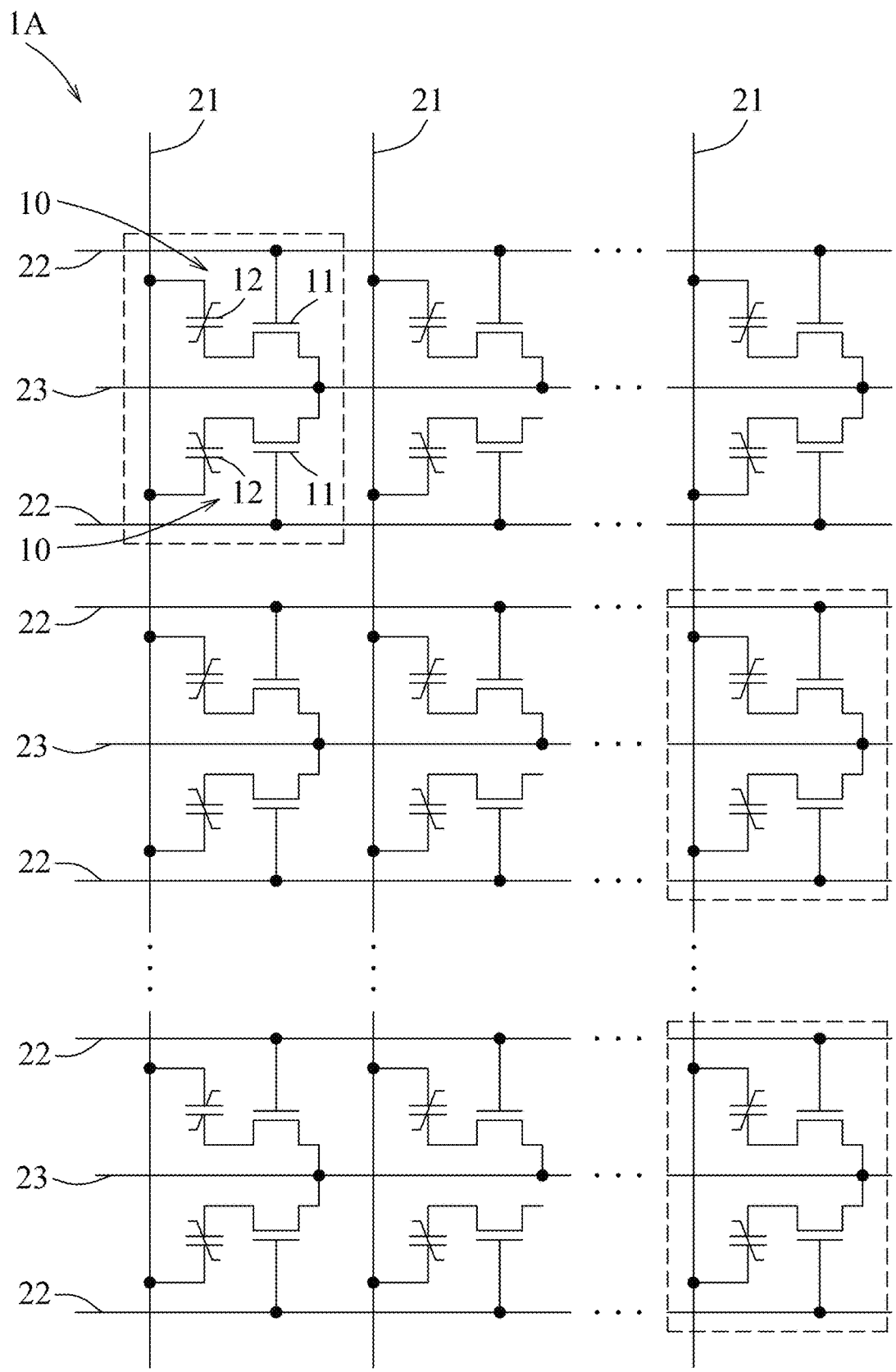
FIG. 9 is a schematic circuit diagram illustrating a FeRAM array in accordance with some embodiments.

FIG. 9 illustrates a FeRAM array 1A where connections between the FeRAM cells 10 and the plate lines 23 are different from those as illustrated in FIG. 1. In the illustrative embodiment of FIG. 9, the FeRAM cells 10 in the same column may be grouped into pairs, and the source electrodes of the access transistors 11 in the same pair of the FeRAM cells 10 are connected to the same plate line 23. During the wake-up operation, the wake-up voltage can be applied to the ferroelectric capacitors 12 by applying the constant voltage of $V_{ref}$ to the word lines 22 and the plate lines 23 and applying the wake-up operation signal that includes the voltage of $(V_{wk}+V_{ref})$ to the bit lines 21 in accordance with some embodiments, so the voltage across the ferroelectric capacitors 12 that correspond to the bit lines 21, the word lines 22 and the plate lines 23 is substantially equal to $V_{wk}$. In a specific implementation, the word lines 22 and the plate lines 23 are applied with 0 volts (e.g., grounded), and a voltage of $V_{wk}$ is applied to the bit lines 21 at the same time to wake up the ferroelectric capacitors 12 of the FeRAM cells 10 that correspond to the bit lines 21, the word lines 22 and the plate lines 23. In accordance with some embodiments, the wake-up voltage can be applied to the ferroelectric capacitors 12 by applying the constant voltage of $V_{ref}$ to the plate lines 23, applying the wake-up operation signal that includes the voltage of $(V_{wk}+V_{ref})$ to the bit lines 21, and applying the turn-on voltage to the word lines 22 to turn on the access transistors 11 (e.g., making the access transistors 11 conduct), so the voltage across the ferroelectric capacitors 12 of the FeRAM cells 10 that correspond to the bit lines 21, the word lines 22 and the plate lines 23 is substantially equal to $V_{wk}$, and the ferroelectric capacitors 12 are woken up. In accordance with some embodiments, the wake-up voltage can be applied to the ferroelectric capacitors 12 by applying the wake-up operation signal that includes the voltage of $(V_{wk}+V_{ref})$ to the plate lines 23, applying the constant voltage of $V_{ref}$ to the bit lines 21, and applying the turn-on voltage to the word lines 22 to turn on the access transistors 11, so the voltage across the ferroelectric capacitors 12 of the FeRAM cells 10 that correspond to the bit lines 21, the word lines 22 and the plate lines 23 is substantially equal to $V_{wk}$, and the ferroelectric capacitors 12 are woken up.

Figure 10:
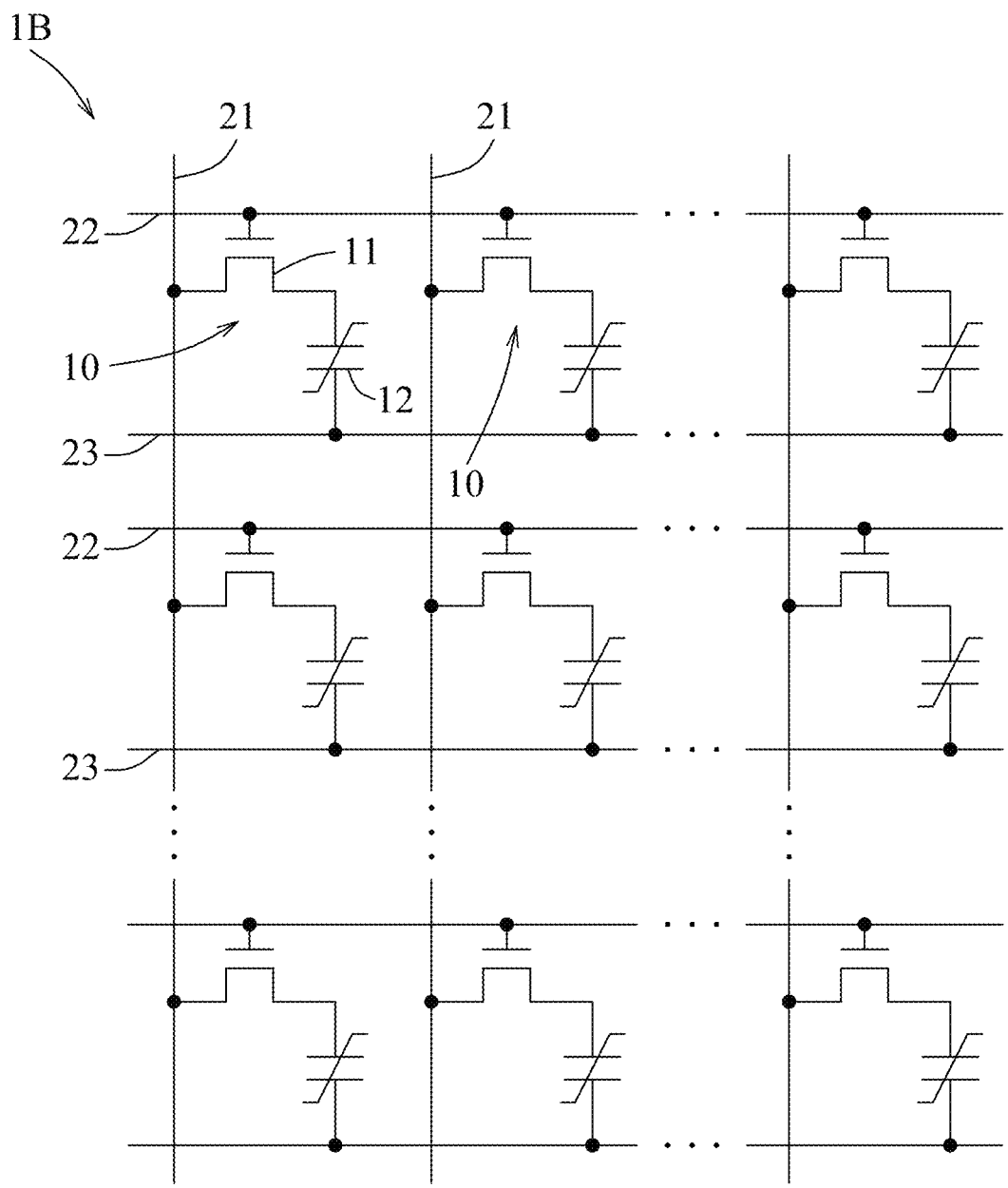
FIG. 10 is a schematic circuit diagram illustrating a FeRAM array in accordance with some embodiments.

FIG. 10 illustrates a FeRAM array 1B where connection between the access transistor 11 and the ferroelectric capacitor 12 of each of the FeRAM cells 10 is different from that illustrated in FIG. 1. In the illustrative embodiment of FIG. 10, for each of the FeRAM cells 10, the gate electrode and the drain region of the access transistor 11 are respectively connected to the corresponding one of the word lines 22 and the corresponding one of the bit lines 21, and the ferroelectric capacitor 12 is connected between the source region of the access transistor 11 and the corresponding one of the plate lines 23. During the wake-up operation, the wake-up voltage can be applied to the ferroelectric capacitors 12 by applying the constant voltage of $V_{ref}$ to the bit lines 21 and the word lines 22 and applying the wake-up operation signal that includes the voltage of ($V_{wk}+V_{ref}$) to the plate lines 23 in accordance with some embodiments, making the voltage across the ferroelectric capacitors 12 that correspond to the bit lines 21, the word lines 22 and the plate lines 23 substantially equal to $V_{wk}$, so as to wake up the ferroelectric capacitors 12 of the FeRAM cells 10. In a specific implementation, the bit lines 21 and the word lines 22 are applied with 0 volts (e.g., grounded), and the wake-up operation signal that includes the voltage of $V_{wk}$ is applied to the plate lines 23 at the same time to wake up the ferroelectric capacitors 12 of the FeRAM cells 10 that correspond to the bit lines 21, the word lines 22 and the plate lines 23. In accordance with some embodiments, the wake-up voltage can be applied to the ferroelectric capacitors 12 by applying the constant voltage of $V_{ref}$ to the plate lines 23, applying the wake-up operation signal that includes the voltage of ($V_{wk}+V_{ref}$) to the bit lines 21, and applying the turn-on voltage to the word lines 22 to turn on the access transistors 11, so the voltage across the ferroelectric capacitors 12 of the FeRAM cells 10 that correspond to the bit lines 21, the word lines 22 and the plate lines 23 is substantially equal to $V_{wk}$, and the ferroelectric capacitors 12 are woken up. In accordance with some embodiments, the wake-up voltage can be applied to the ferroelectric capacitors 12 by applying the constant voltage of $V_{ref}$ to the bit lines 21, applying the wake-up operation signal that includes a voltage of ($V_{wk}+V_{ref}$) to the plate lines 23, and applying the turn-on voltage to the word lines 22 to turn on the access transistors 11, so the voltage across the ferroelectric capacitors 12 of the FeRAM cells 10 that correspond to the bit lines 21, the word lines 22 and the plate lines 23 is substantially equal to $V_{wk}$, and the ferroelectric capacitors 12 are woken up.

In accordance with some embodiments, for each of the FeRAM cells 10, the ferroelectric capacitor 12 may be connected to any one of the multiple terminals (e.g., the gate electrode, the drain region and the source region) of the access transistor 11, and the wake-up operation may be performed in other manners, as long as the resultant voltage across the ferroelectric capacitor 12 is greater than the coercive voltage.

In accordance with some embodiments, the wake-up operation may be performed at either wafer level or package level. To enable the wafer-level wake-up operation, the wafer may be designed to have one or more bit-line contact pads that are collectively connected to all of the bit lines 21, one or more word-line contact pads that are collectively connected to all of the word lines 22, and one or more plate-line contact pads that are collectively connected to all of the plate lines 23. In some embodiments, when the wake-up operation is performed, the desired voltage signals (e.g., the constant voltage of $V_{ref}$ in the wake-up operation signal that includes a voltage of ($V_{ref}+V_{wk}$)) may be applied to the bit-line contact pad(s), the word-line contact pad(s), and the plate-line contact pad(s) at the same time to wake up the ferroelectric capacitors 12 of all of the FeRAM cells 10 on the wafer. In some embodiments, the FeRAM cells 10 on the wafer may be classified into multiple FeRAM arrays, and the wafer may be designed to have multiple bit-line contact pads respectively corresponding to the FeRAM arrays, multiple word-line contact pads respectively corresponding to the FeRAM arrays, and multiple plate-line contact pads respectively corresponding to the FeRAM arrays, where each of the bit-line contact pads is electrically connected to all of the bit lines 21 of the corresponding one of the FeRAM arrays, each of the word-line contact pads is electrically connected to all of the word lines 22 of the corresponding one of the FeRAM arrays, and each of the plate-line contact pads is electrically connected to all of the plate lines 23 of the corresponding one of the FeRAM arrays. In such a scenario, the wafer-level wake-up operation may be performed on the FeRAM arrays in groups with each group including one or more FeRAM arrays, namely, the wake-up operation may be performed on one or more (but not all) FeRAM arrays at a time, and repeated for other one or more FeRAM arrays until the wake-up operation has been performed on all of the FeRAM arrays on the wafer. In the package-level operation, the wafer has been cut into multiple dies, and the dies have been packaged into chips, so the wake-up operation can be performed on the chips one by one. In the scenario of either the wafer-level wake-up or package-level wake-up, the wake-up operation is performed on all of the FeRAM cells that were on the wafer before the final product (e.g., the chips that include those FeRAM cells) is shipped out of the factory to customers, so the customers are not required to spend their time waking up the FeRAM cells of the chips.

Figure 11:
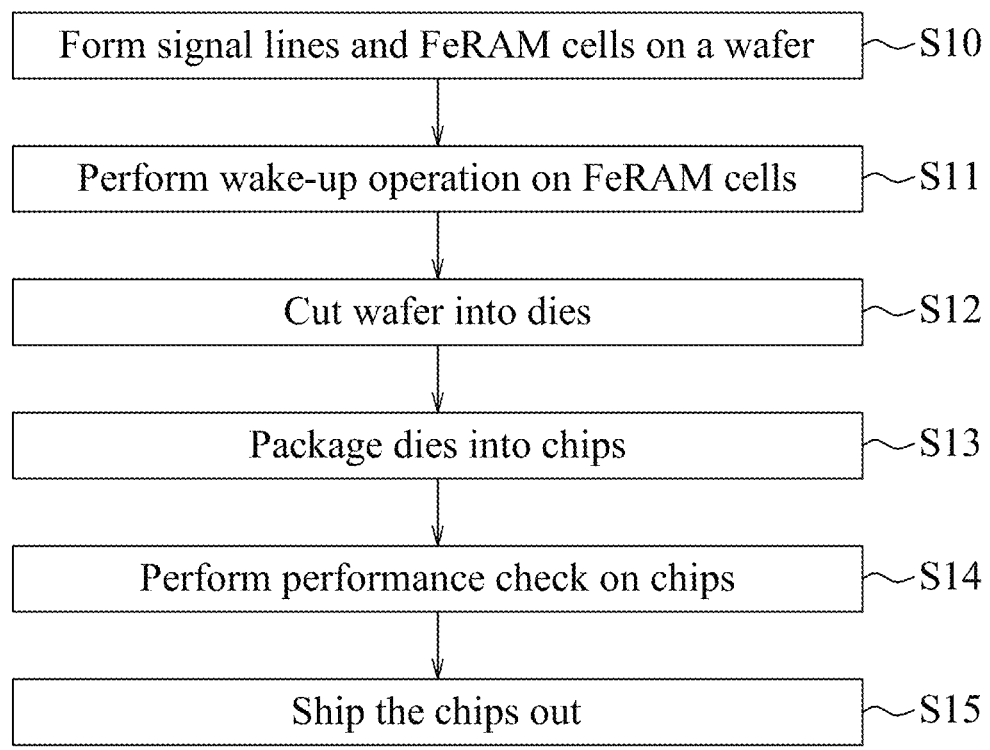
FIG. 11 is a flow chart illustrating a scenario that the wake-up operation is performed at wafer level in accordance with some embodiments.

FIG. 11 illustrates a flow chart of the wafer-level wake-up operation in accordance with some embodiments. Further referring to FIG. 1, in step S10, a wafer is formed with a plurality of bit lines 21, a plurality of word lines 22, and a plurality of plate lines 23, and a plurality of FeRAM cells 10 that cooperatively constitute a FeRAM array 1. Each of the FeRAM cells 10 is electrically connected to one of the bit lines 21, one of the word lines 22, and one of the plate lines 23, and includes an access transistor 11 and a ferroelectric capacitor 12. The ferroelectric capacitor 12 is electrically connected between one of the terminals (e.g., gate electrode, drain region and source region) of the access transistor 11 and one of the signal lines (i.e., the bit line 21, the word line 22 and the plate line 23) that corresponds to the FeRAM cell 10.

In step S11, a wake-up operation is performed on all of the FeRAM cells 10 in the FeRAM array 1 simultaneously. The wake-up operation includes applying a bit-line voltage signal to the bit lines 21, applying a word-line voltage signal to the word lines 22, and applying a plate-line voltage signal to the plate lines 23 at the same time, where the bit-line voltage signal, the word-line voltage signal and the plate-line voltage signal are applied in such a way that a wake-up voltage signal across the ferroelectric capacitor 12 of each of the FeRAM cells 10 in the FeRAM array 1 has, at least in part, a voltage greater than the coercive voltage of the ferroelectric capacitor 12. The wake-up voltage signal has at least a positive voltage portion and a negative voltage portion. The positive voltage portion has, at least in part, a positive voltage of which a magnitude is greater than the coercive voltage of the ferroelectric capacitor 12, and the negative voltage portion has, at least in part, a negative voltage of which a magnitude is greater than the coercive voltage of the ferroelectric capacitor 12. The positive voltage portion and the negative voltage portion can be either symmetric or asymmetric with respect to zero volts. The wake-up voltage signal can be a DC voltage, an AC voltage, a periodic pulse signal, a non-periodic pulse signal, a combination of a single positive pulse and a single negative pulse, some other suitable signal forms, or any combination thereof. In step S12, the wafer is cut into multiple dies that include the FeRAM cells 10 formed therein. In step S13, the dies are packaged into chips. In step S14, a performance check is performed on the chips. In step S15, the chips are shipped out of the factory to customers.

Figure 12:
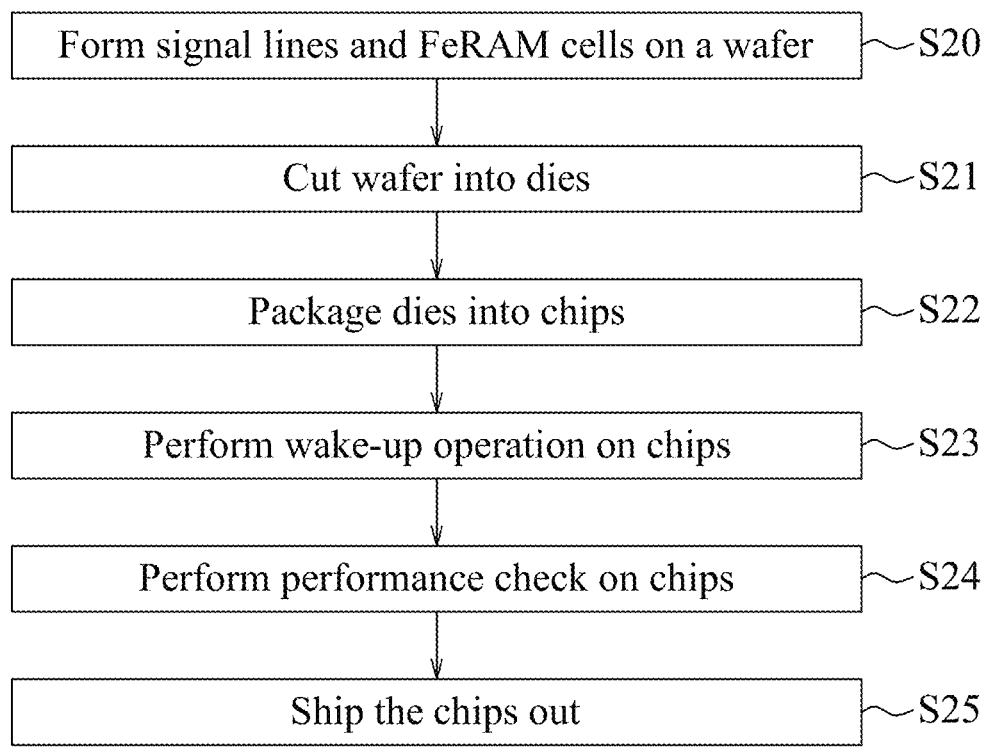
FIG. 12 is a flow chart illustrating a scenario that the wake-up operation is performed at package level in accordance with some embodiments.

FIG. 12 illustrates a flow chart of the package-level wake-up operation in accordance with some embodiments. Further referring to FIG. 1, in step S20, a wafer is formed with a plurality of bit lines 21, a plurality of word lines 22, a plurality of plate lines 23, and a plurality of FeRAM cells 10. In step S21, the wafer is cut into multiple dies that include the FeRAM cells 10 formed therein. For each of the dies, the FeRAM cells 10 therein may constitute a FeRAM array 1. In step S22, the dies are packaged into chips. In step S23, the wake-up operation is performed on the chips to wake up the ferroelectric capacitors 12 of the FeRAM cells 10 of the FeRAM array 1 in the chip simultaneously. For each of the chips, the wake-up operation includes applying a bit-line voltage signal to the bit lines 21 that correspond to the FeRAM cells 10 of the FeRAM array 1, applying a word-line voltage signal to the word lines 22 that correspond to the FeRAM cells 10 of the FeRAM array 1, and applying a plate-line voltage signal to the plate lines 23 that correspond to the FeRAM cells 10 of the FeRAM array 1 at the same time, where the bit-line voltage signal, the word-line voltage signal and the plate-line voltage signal are applied in such a way that a wake-up voltage signal across the ferroelectric capacitor 12 of each of the FeRAM cells 10 in the FeRAM array 1 has, at least in part, a voltage greater than a coercive voltage of the ferroelectric capacitor 12. The wake-up voltage signal has at least a positive voltage portion and a negative voltage portion. The positive voltage portion has, at least in part, a positive voltage of which a magnitude is greater than the coercive voltage of the ferroelectric capacitor 12, and the negative voltage portion has, at least in part, a negative voltage of which a magnitude is greater than the coercive voltage of the ferroelectric capacitor 12. The positive voltage portion and the negative voltage portion can be either symmetric or asymmetric with respect to zero volts. The wake-up voltage signal can be a DC voltage, an AC voltage, a periodic pulse signal, a non-periodic pulse signal, a combination of a single positive pulse and a single negative pulse, some other suitable signal forms, or any combination thereof. In step S24, a performance check is performed on the chips. In step S25, the chips are shipped out of the factory to customers.

Figure 13A:
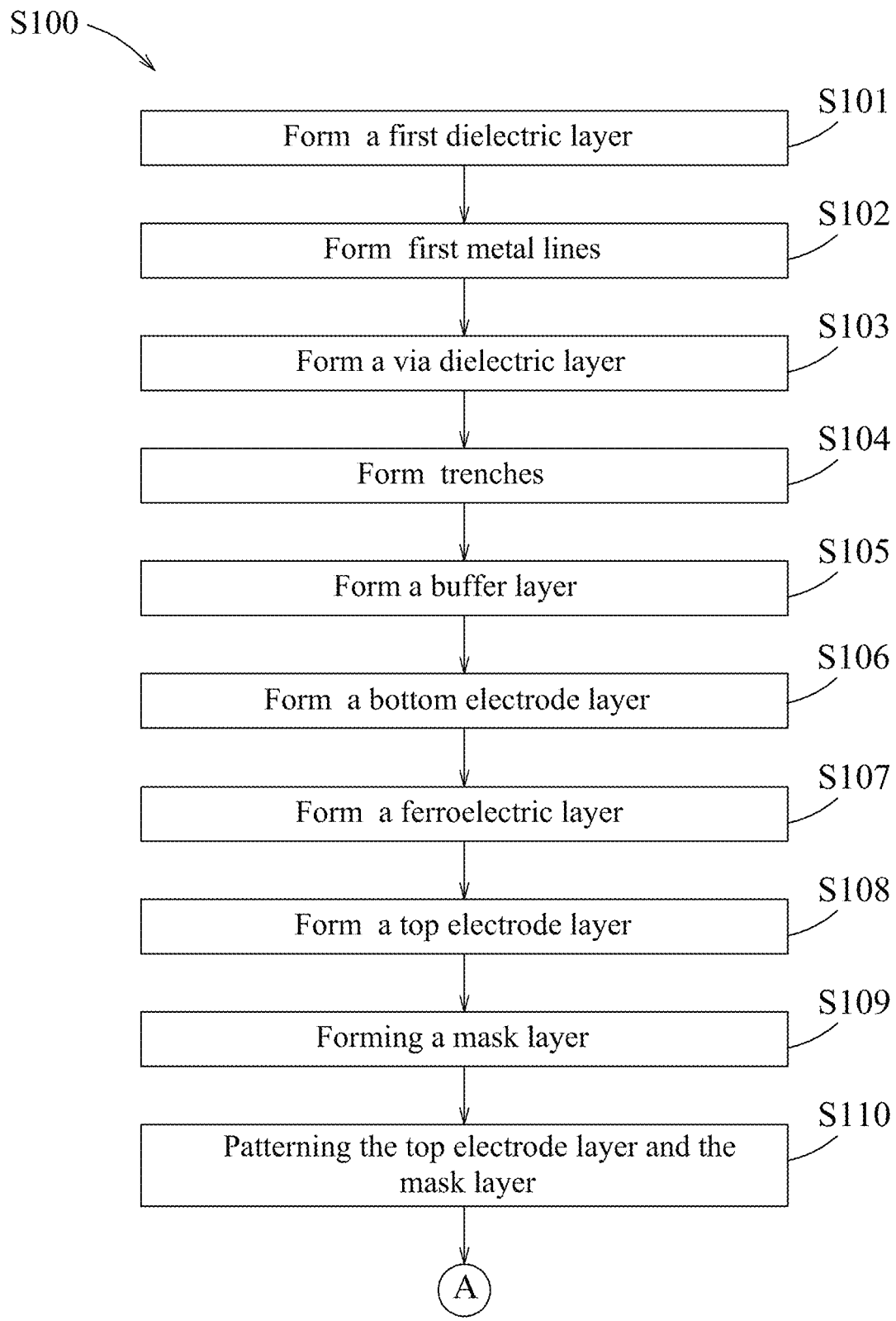
FIGS. 13A, 13B and 14 through 33 cooperatively illustrate a process of manufacturing an exemplary structure of ferroelectric capacitors in accordance with some embodiments.
Figure 13B:
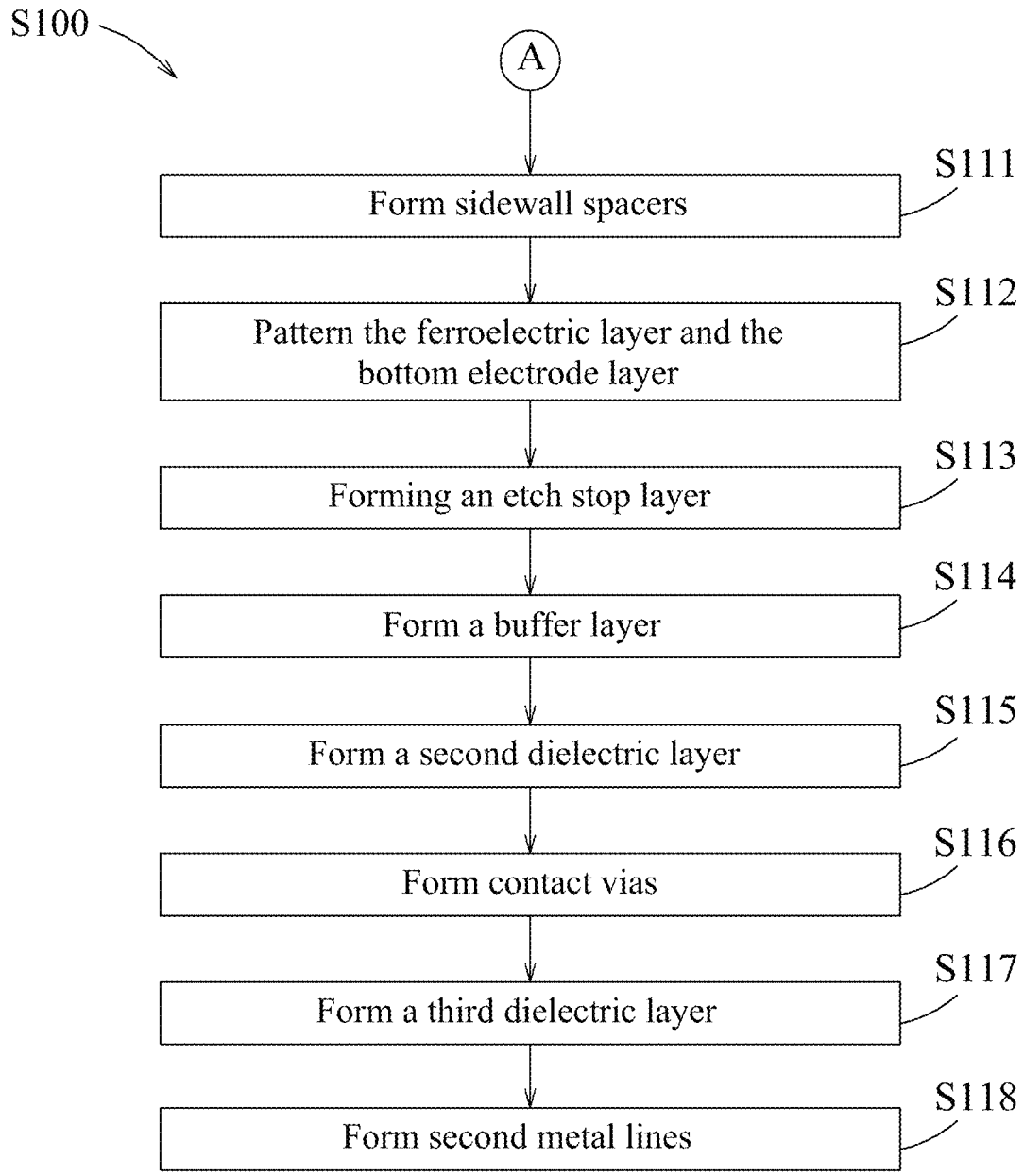

FIGS. 13A and 13B show a flow chart that cooperates with FIGS. 14 through 33 to illustrate a process to form the structure of the ferroelectric capacitor as shown in FIG. 3 in accordance with some embodiment.

Figure 14:
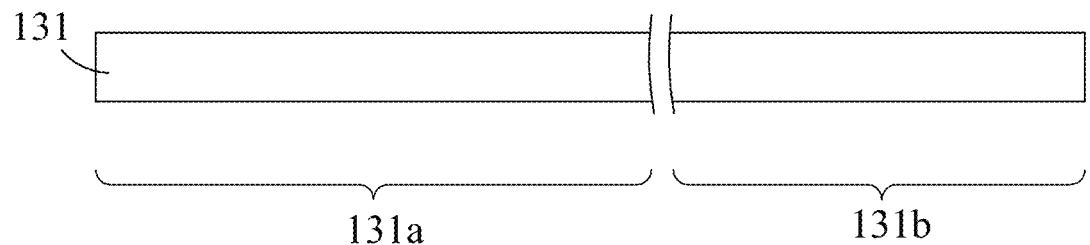

Referring to FIGS. 13A and 14, the method S100 begins at step S101, where a first dielectric layer (which is subsequently formed into the lower interconnect dielectric layer in FIG. 3 and is also denoted by reference numeral 131) is formed. In some embodiments, the first dielectric layer 131 may be formed using, for example, chemical vapor deposition (CVD), physical vapor deposition (PVD), or other suitable deposition techniques. The materials for the first dielectric material is similar to those for the lower interconnect dielectric layer 131 described above, and the details thereof are omitted for the sake of brevity. In some embodiments, the first dielectric layer 131 may include a memory region 131a and a peripheral region 131b.

Figure 15:
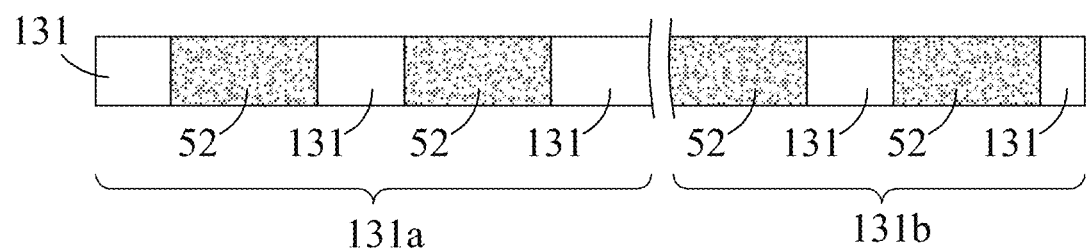

Referring to FIGS. 13A and 15, the method S100 proceeds to step S102, where first metal lines 52 are formed in the first dielectric layer 131. Each of the first metal lines 52 on the memory region 131a may serve as the bottom electrode wire $31_{BE}$ in FIG. 3. Step S102 may be implemented by (i) patterning the first dielectric layer 131 to form first recesses (not shown), (ii) depositing a metallic material on the first dielectric layer 131 to fill the first recesses, and (iii) removing the excess metallic material on the first dielectric layer 131. In some embodiments, the first dielectric layer 131 is patterned using known photolithography and etching processes. The photolithography process may include, for example, but not limited to, coating a photoresist, soft-baking, exposing the photoresist through a photomask, post-exposure baking, and developing the photoresist, followed by hard-baking so as to form a patterned photoresist. The etching process may be implemented by etching the first dielectric layer 131 through the patterned photoresist using, for example, dry etching, wet etching, a combination thereof, or other suitable etching techniques. In some embodiments, the deposition of the metallic material for the first metal lines 52 may be implemented using, for example, CVD, PVD, electroless plating, electroplating, or other suitable deposition techniques. The materials for the first metal lines 52 are similar to those of the bottom electrode wire $31_{BE}$ described above, and thus the details thereof are omitted for the sake of brevity. In some embodiments, the removal of the excess metallic material may be implemented using, for example, chemical mechanical polishing (CMP), or other suitable planarization techniques.

Figure 16:
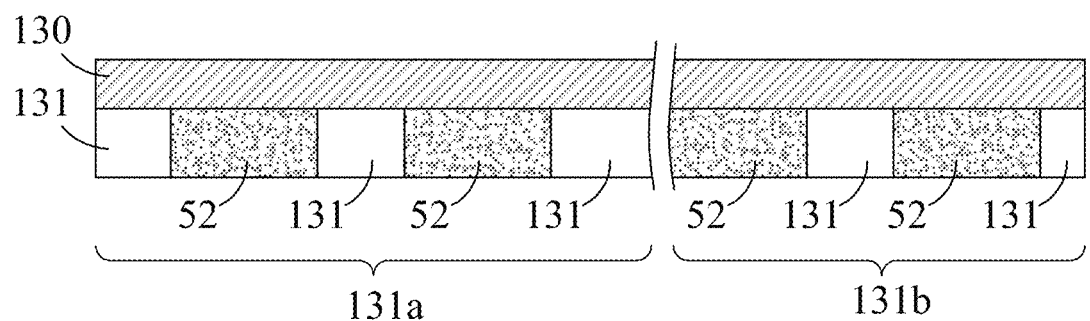

Referring to FIGS. 13A and 16, the method S100 proceeds to step S103, where the via dielectric layer 130 is formed on the first dielectric layer 131 and the first metal lines 52. In some embodiments, the via dielectric layer 130 may be formed using, for example, CVD, plasma-enhanced chemical vapor deposition (PECVD), atomic layer deposition (ALD), spin-on coating, electroless plating, or other suitable deposition techniques. The materials for the via dielectric layer 130 are described above, and thus the details thereof are omitted for the sake of brevity. In some embodiments, after step S103, a top surface of the via dielectric layer 130 may be planarized using, for example, CMP, or other suitable planarization techniques.

Figure 17:
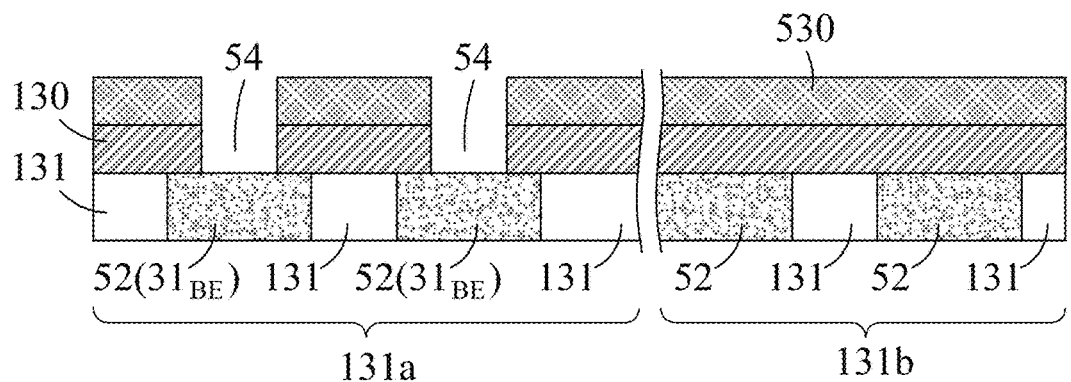

Referring to FIGS. 13A and 17, the method S100 proceeds to step S104, where trenches 54 are formed in the via dielectric layer 130 on the memory region 131a to expose the first metal lines 52 in the memory region 131a (i.e., the bottom electrode wire $31_{BE}$). Step S104 may be implemented by patterning the via dielectric layer 130 using a patterned photoresist layer 530 to form the trenches 54. The patterning process may include known photolithography and etching processes as described above in step S102, and the details thereof are omitted for the sake of brevity. The patterned photoresist layer 530 may be removed after step S104. Other suitable techniques may be used for patterning the via dielectric layer 130.

Figure 18:
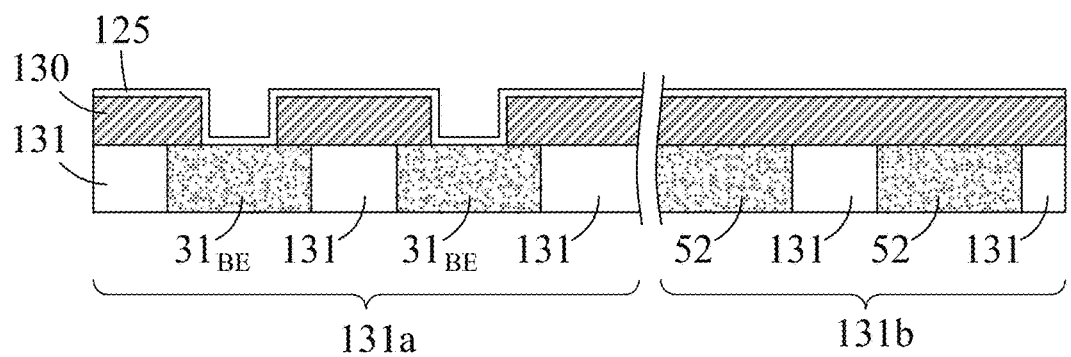

Referring to FIGS. 13A and 18, the method S100 proceeds to step S105, where a buffer layer 125 is conformally formed on the top surface of the via dielectric layer 130 and inner surfaces of the trenches 54 (see FIG. 17). In some embodiments, the buffer layer 125 may be formed using, for example, CVD, metal organic chemical vapor deposition (MOCVD), PVD, ALD, or other suitable deposition techniques. In some embodiments, the buffer layer 125 may include, but not limited to, titanium nitride, platinum, aluminum copper, gold, titanium, tantalum, tantalum nitride, tungsten, tungsten nitride, alloys thereof, or combinations thereof. Other suitable materials for the buffer layer 125 are within the contemplated scope of the present disclosure. The buffer layer 125 is in direct contact with the bottom electrode wires $31_{BE}$ in the trenches 54.

Figure 19:
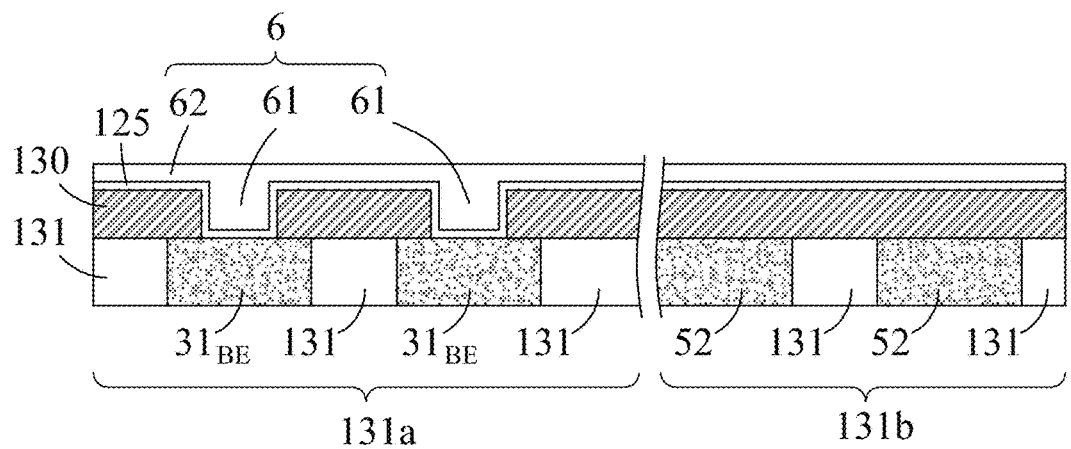
Figure 19A:
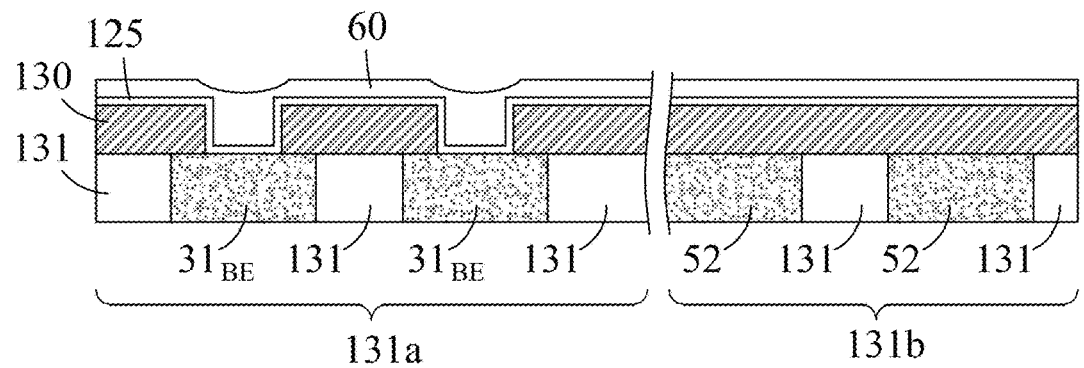
Figure 20:
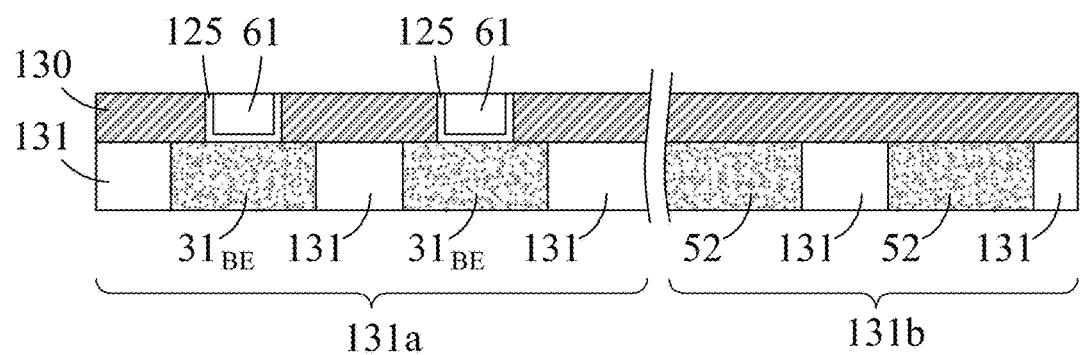
Figure 21:
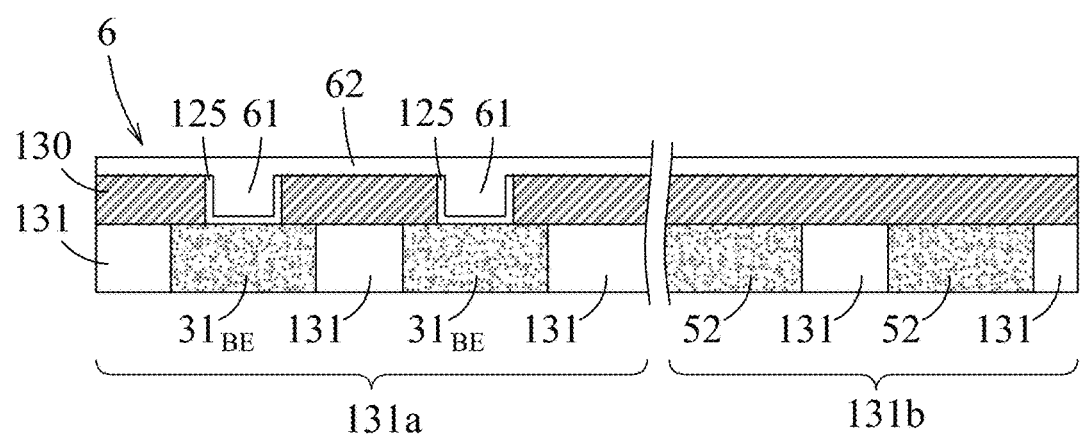

Referring to FIGS. 13A and 19, the method S100 proceeds to step S106, where a bottom electrode layer 6 is formed on the buffer layer 125 and fills the trenches 54 (see FIG. 17). The materials for the bottom electrode layer 6 are similar to those for the bottom electrode via 124 and/or the bottom electrode 122 in FIG. 3, and thus the details thereof are omitted for the sake of brevity. The bottom electrode layer 6 is electrically connected to the bottom electrode wires $31_{BE}$ through the buffer layer 125. In some embodiments, the bottom electrode layer 6 and the buffer layer 125 may be made of the same or different materials. The bottom electrode layer 6 includes filler portions 61 filling the trenches 54, and a layer portion 62 disposed on the via dielectric layer 130 to cover the filler portions 61. In some embodiments, step S106 includes (i) depositing an electrode material layer over the structure of FIG. 18 using, for example, CVD, PVD, ALD, or other suitable deposition techniques, and (ii) planarizing the electrode material layer on the via dielectric layer 130 using, for example, CMP, or other suitable planarization techniques, to thereby obtain the filler portions 61 and the layer portion 62 of the bottom electrode layer 6 shown in FIG. 19. In alternative embodiments, step S106 includes (i) depositing an electrode material layer 60 over the structure of FIG. 18 using, for example, CVD, PVD, ALD, or other suitable deposition techniques to obtain a structure shown in FIG. 19A, (ii) removing the excess electrode material layer 60 and the excess buffer layer 125 on the via dielectric layer 130 using, for example, CMP, or other suitable planarization techniques, so as to form a structure as shown in FIG. 20, and (iii) further depositing another electrode material layer, which serves as the layer portion 62 of the bottom electrode layer 6, on the via dielectric layer 130 and the filler portions 61 (see FIG. 21). The filler portions 61 and the layer portion 62 may be made of the same material or different materials. The remaining buffer layer 125 may prevent diffusion of metal in the bottom electrode wires $31_{BE}$ into the filler portions 61 (corresponding to the bottom electrode via 124 in FIG. 3). For the sake of simplicity, the configuration of FIG. 21 will be used for subsequent figures.

Figure 22:
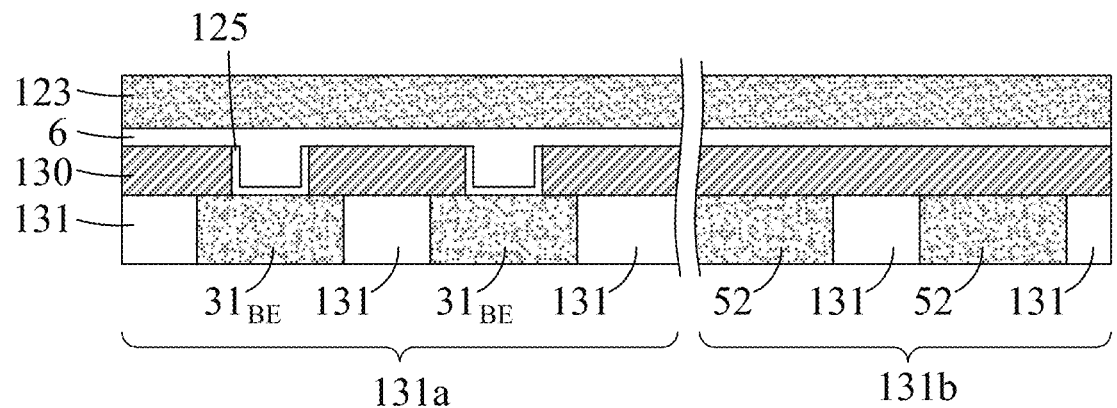

Referring to FIGS. 13A and 22, the method S100 proceeds to step S107, where a ferroelectric layer (which corresponds to the ferroelectric structure described above, and is also denoted by reference numeral 123) is formed on the bottom electrode layer 6 opposite to the via dielectric layer 130. The materials for the ferroelectric layer 123 are similar to those for the ferroelectric structure described above, and thus the details thereof are omitted for the sake of brevity. In some embodiments, the ferroelectric layer 123 may be formed using, for example, such as CVD, PVD, ALD, plasma-enhanced ALD, molecular beam epitaxy (MBE), or other suitable deposition techniques. In some embodiments, the ferroelectric layer 123 may be constructed in a single-layer form. In alternative embodiments, the ferroelectric layer 123 may include a plurality of films with different materials.

Figure 23:
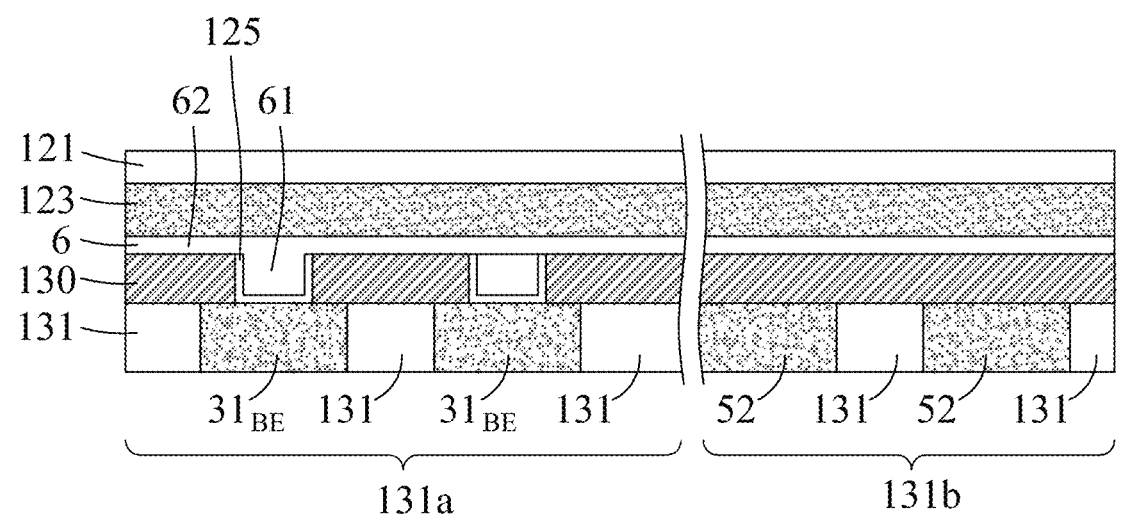

Referring to FIGS. 13A and 23, the method S100 proceeds to step S108, where a top electrode layer (which corresponds to the top electrode described above and is also denoted by reference numeral 121) is formed on the ferroelectric layer 123 opposite to the bottom electrode layer 6. In some embodiments, the top electrode layer 121 may be formed using, for example, CVD, PVD, ALD, or other suitable deposition techniques. The materials for the top electrode layer 121 are similar to those for the top electrode described above, and thus the details thereof are omitted for the sake of brevity. In some embodiments, the top electrode layer 121 may be constructed in a single-layer form. In alternative embodiments, the top electrode layer 121 may include a plurality of films with different materials.

Figure 24:
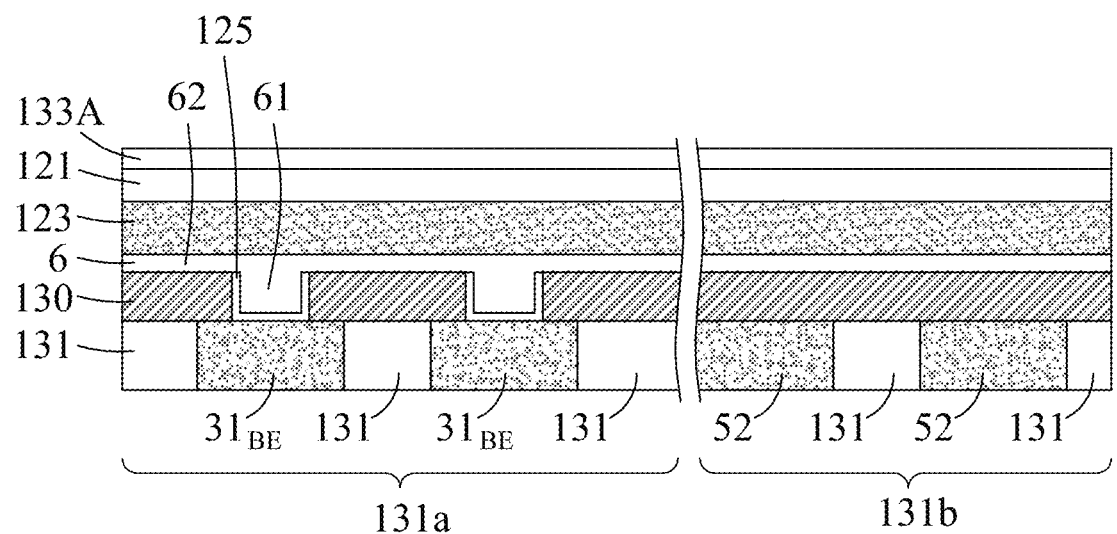

Referring to FIGS. 13A and 24, the method S100 proceeds to step S109, where a mask layer 133A is formed on the top electrode layer 121 opposite to the ferroelectric layer 123. In some embodiments, the mask layer 133A may be formed using, for example, CVD, PVD, ALD, or other suitable deposition techniques. The materials for the mask layer 133A are similar to those for the mask layer described above, and thus the details thereof are omitted for the sake of brevity.

Figure 25:
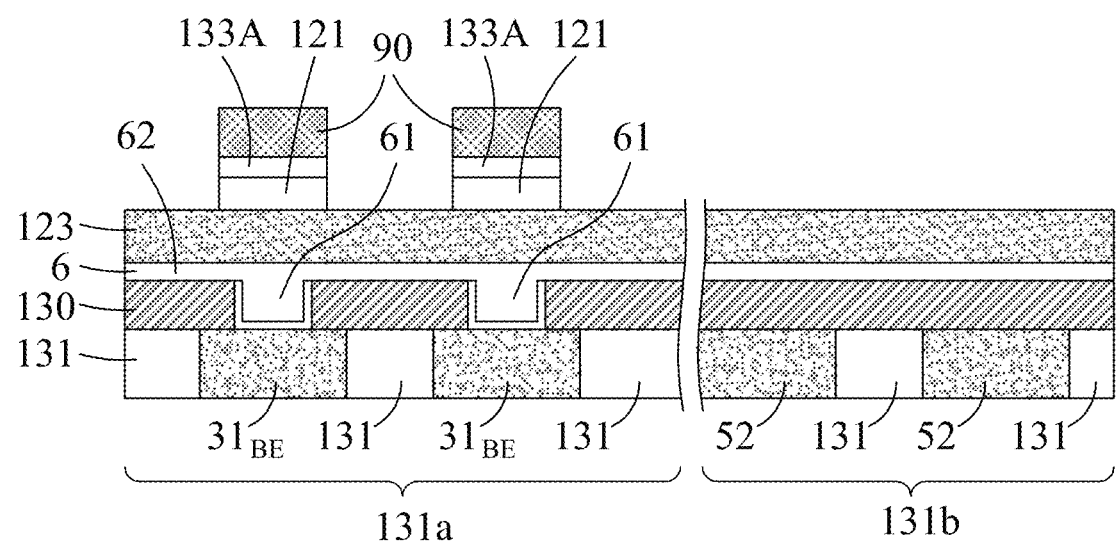

Referring to FIGS. 13A and 25, the method S100 proceeds to step S110, where the top electrode layer 121 and the mask layer 133A shown in FIG. 24 are patterned using a patterned photoresist layer 90 to form top electrodes 121 (also shown in FIG. 3) which is located beneath the patterned mask layer 133A. The patterning process may include known photolithography and etching processes as described above in step S102, and the details thereof are omitted for the sake of brevity. After step S110, a plurality of stacks (each including one of the top electrodes 121 and a corresponding portion of the patterned mask layer 133A) are formed in positions corresponding to the filler portions 61 of the bottom electrode layer 6, respectively. The patterned photoresist layer 90 may be removed after step S110. Other suitable techniques may be used for patterning the top electrode layer 121 and the mask layer 133A.

Figure 26:
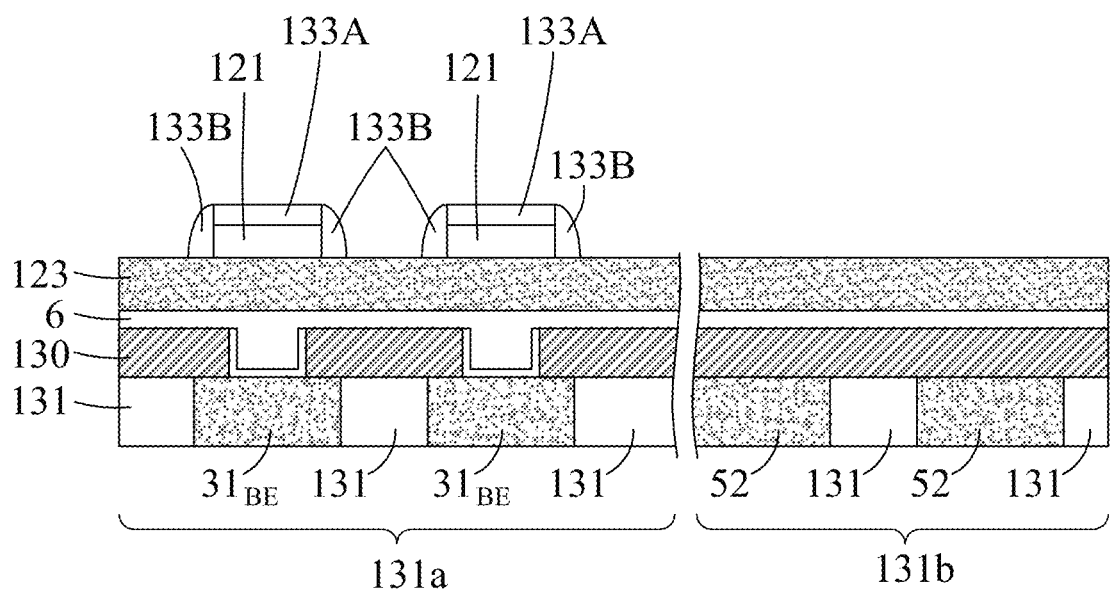

Referring to FIGS. 13B and 26, the method S100 proceeds to step S111, where a pair of sidewall spacers 133B are respectively formed at two lateral sides of each of the stacks obtained in step S110. In some embodiments, step S112 includes (i) depositing a sidewall spacer material layer (not shown) over the structure of FIG. 25 using, for example, CVD, PVD, ALD, or other suitable deposition techniques, and (ii) anisotropically etching (e.g., dry etching, wet etching, a combination thereof, or other suitable etching techniques) the sidewall spacer material layer to permit the sidewall spacers 133B to be formed on the lateral sides of each of the stacks. The materials for the sidewall spacers 133B are described above, and thus the details thereof are omitted for the sake of brevity.

Figure 27:
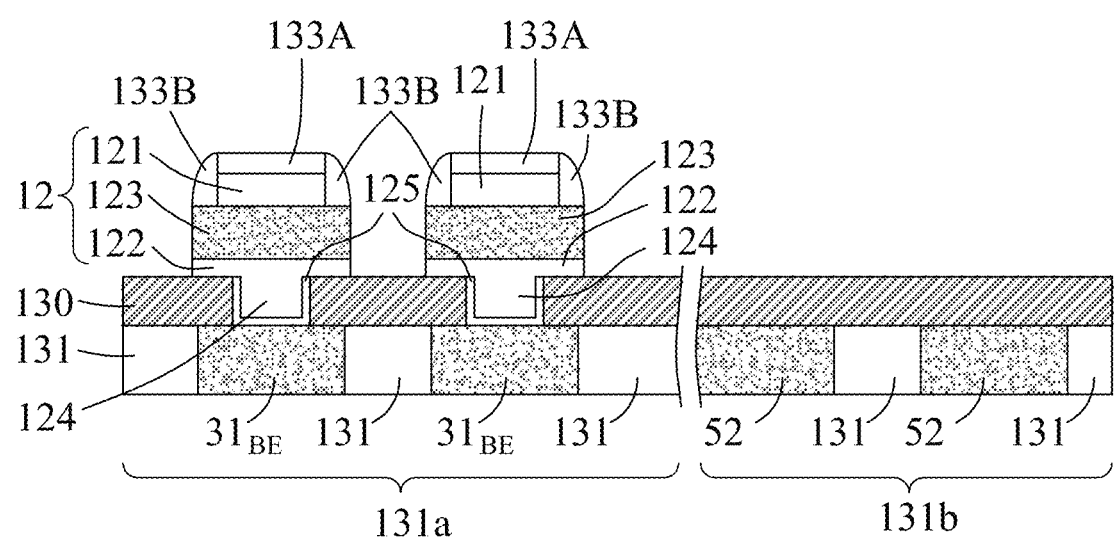

Referring to FIGS. 13B and 27, the method S100 proceeds to step S112, where the ferroelectric layer 123 and the bottom electrode layer 6 shown in FIG. 26 are patterned to form the ferroelectric features 123 (one of which is also shown in FIG. 3) and the bottom electrodes 122 (one of which is also shown in FIG. 3) on the memory region 131a. The bottom electrodes 122 are respectively connected to the bottom electrode vias 124. After step S112, the ferroelectric capacitors 12 are formed. In some embodiments, the ferroelectric layer 123 and the bottom electrode layer 6 are etched using, for example, dry etching, wet etching, a combination thereof, or other suitable etching techniques.

Figure 28:
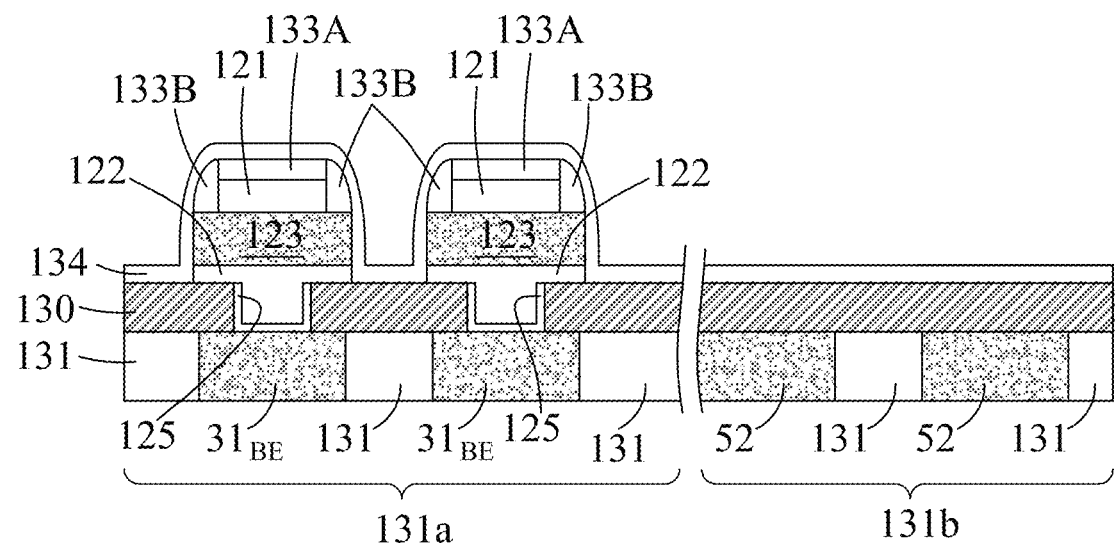

Referring to FIGS. 13B and 28, the method S100 proceeds to step S113, where an etch stop layer 134 is conformally formed on the structure shown in FIG. 27. In some embodiments, the etch stop layer 134 may be formed using, for example, CVD, PECVD, ALD, spin-on coating, electroless plating, or other suitable deposition techniques. The materials for the etch stop layer 134 are described above and thus the details thereof are omitted for the sake of brevity.

Figure 29:
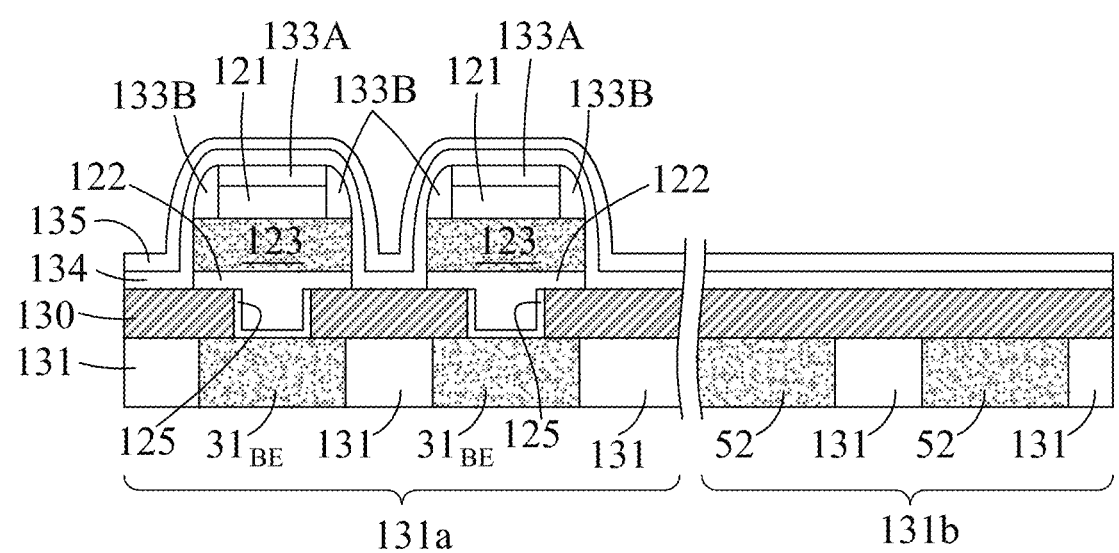

Referring to FIGS. 13B and 29, the method S100 proceeds to step S114, where a buffer layer 135 is formed on the etch stop layer 134. In some embodiments, the buffer layer 135 may be conformally formed using, for example, CVD, PECVD, or other suitable deposition techniques. The materials for the buffer layer 135 are described above and thus the details thereof are omitted for the sake of brevity.

Figure 30:
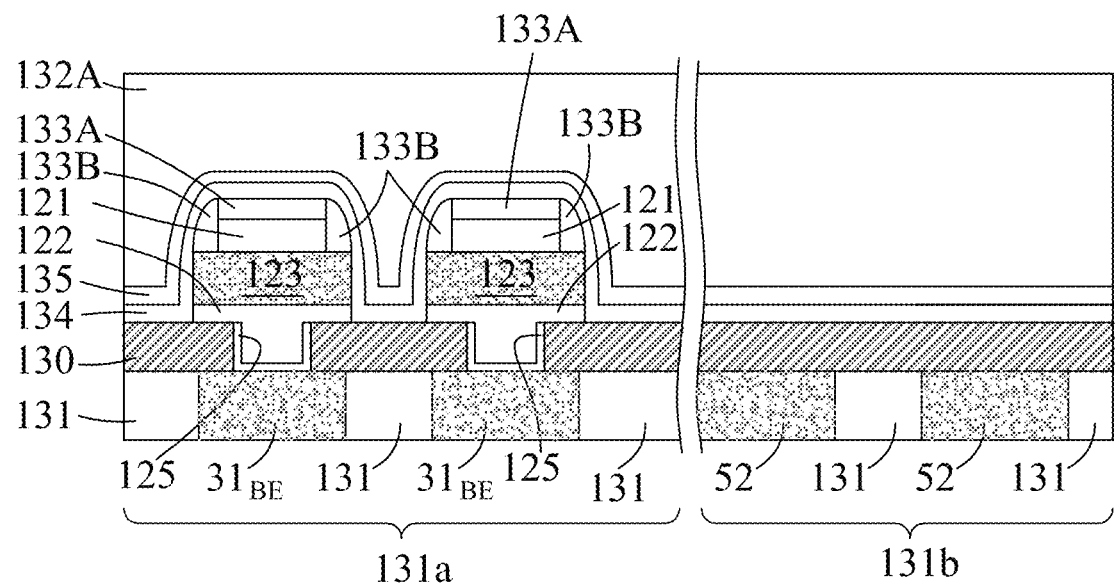

Referring to FIGS. 13B and 30, the method S100 proceeds to step S115, where a second dielectric layer 132A is formed on the buffer layer 135. In some embodiments, the second dielectric layer 132A may be formed using, for example, CVD, PVD, or other suitable deposition techniques, followed by planarization through, such as CMP or other suitable techniques. The materials for the second dielectric layer 132A may be similar to those for the first dielectric layer 131, and the details thereof are omitted for the sake of brevity.

Figure 31:
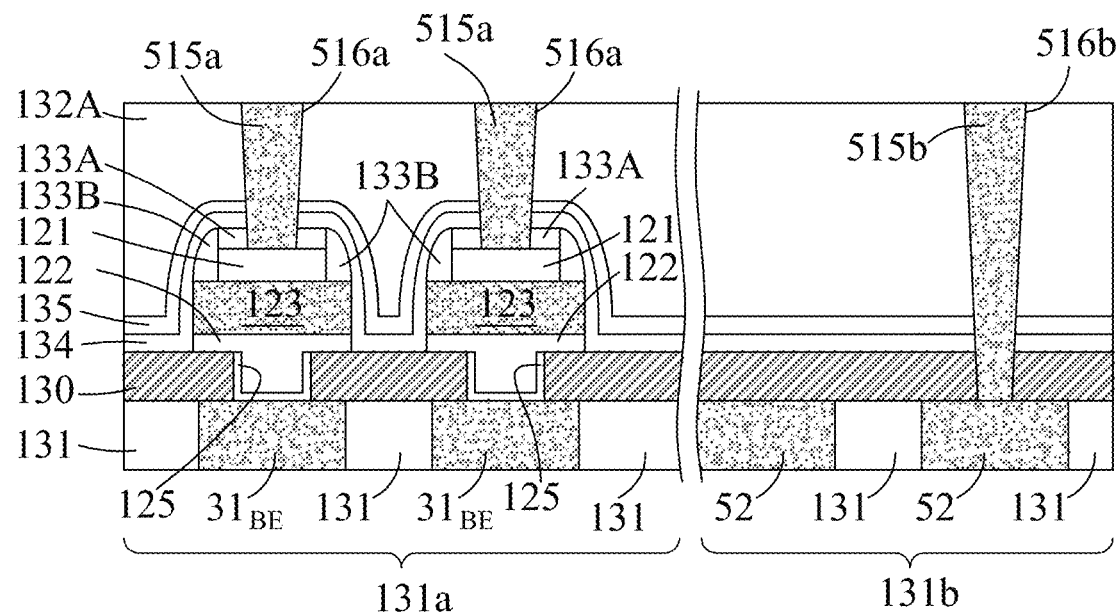

Referring to FIGS. 13B and 31, the method S100 proceeds to step S116, where contact vias 515a, 515b are formed in the second dielectric layer 132A. The contact vias 515a may serve as the top electrode via $32_{TE}$ in FIG. 3. Step S116 may be implemented by (i) patterning the second dielectric layer 14 to form trenches 516a, 516b, (ii) depositing a contact material for the contact vias 515a, 515b on the second dielectric layer 132A to fill the trenches 516a, 516b, and (iii) removing the excess contact material on the second dielectric layer 132A. Each of the trenches 516a penetrates the second dielectric layer 132A, the buffer layer 135, the second etch stop layer 134 and the masks 133A to expose a corresponding one of the top electrodes 121 on the memory region 131a. The second trench 516b penetrates the second dielectric layer 132A, the buffer layer 135, the second etch stop layer 134 and the via dielectric layer 130 to expose a corresponding one of the first metal lines 52 on the peripheral region 131b. In some embodiments, the deposition of the contact material may be implemented using, for example, CVD, PVD, electroless plating, electroplating, or other suitable deposition techniques. The materials for the contact vias 515a, 515b are similar to those for the top electrode via $32_{TE}$ described above, and the details thereof are omitted for the sake of brevity. In some embodiments, the removal of the excess contact material may be implemented using, for example, CMP, or other suitable planarization techniques. The contact vias 515a filling the trenches 516a are electrically and respectively connected to the top electrodes 121 on the memory region 131a. The contact via 515b filling the second trench 516b is electrically and directly connected to the corresponding one of the first metal lines 52 on the peripheral region 131b.

Figure 32:
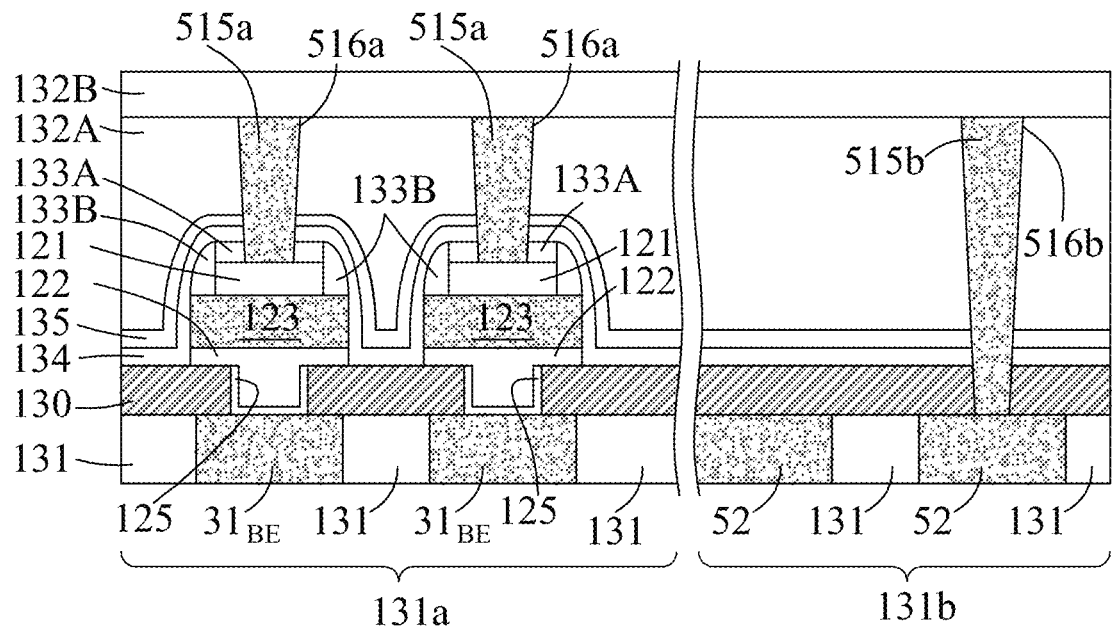

Referring to FIGS. 13B and 32, the method S100 proceeds to step S117, where a third dielectric layer 132B is formed on the second dielectric layer 132A and the contact vias 515a, 515b. The second dielectric layer 132A and the third dielectric layer 132B cooperatively form the upper interconnect layer 132 in FIG. 3. In some embodiments, the material and formation for the third dielectric layer 132B may be similar to those for the first dielectric layer 131, and the details thereof are omitted for the sake of brevity.

Figure 33:
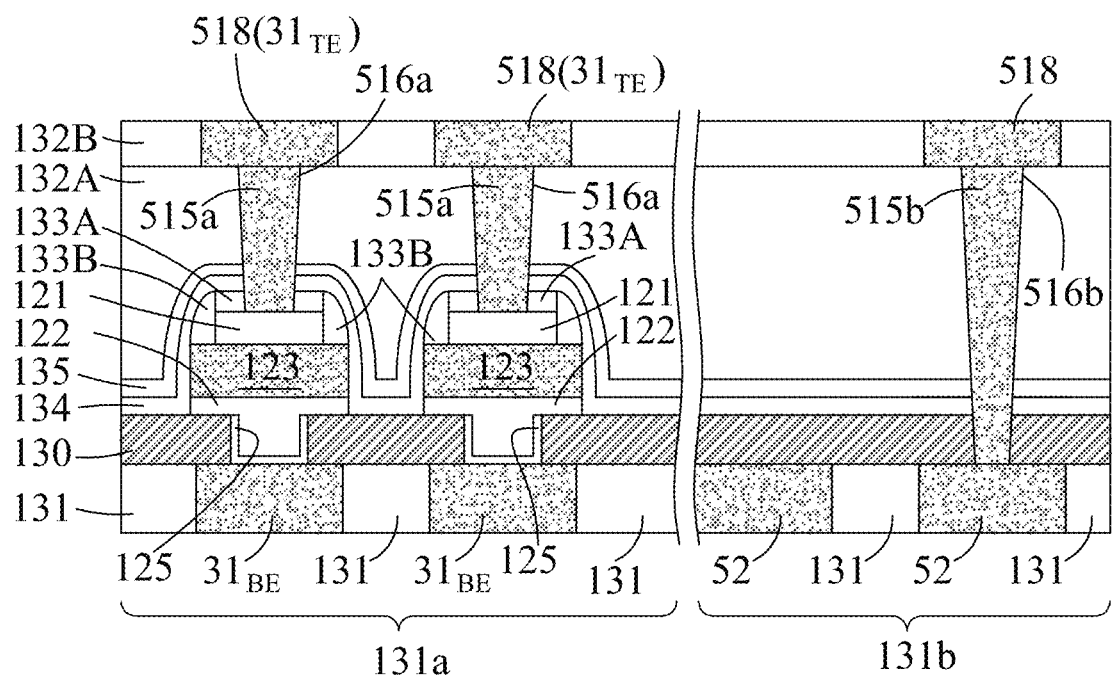

Referring to FIGS. 13B and 33, the method S100 proceeds to step S118, where second metal lines 518 are formed in the third dielectric layer 132B such that the second metal lines 518 are respectively in electrical contact with the contact vias 515a, 515b. The top electrode wires 518 on the memory region 131a may serve as the top electrode wire $31_{TE}$ in FIG. 3. The materials for the second metal lines 518 are similar to those for the top electrode wire $31_{TE}$ described above, and the details thereof are omitted for the sake of brevity.

Figure 34:
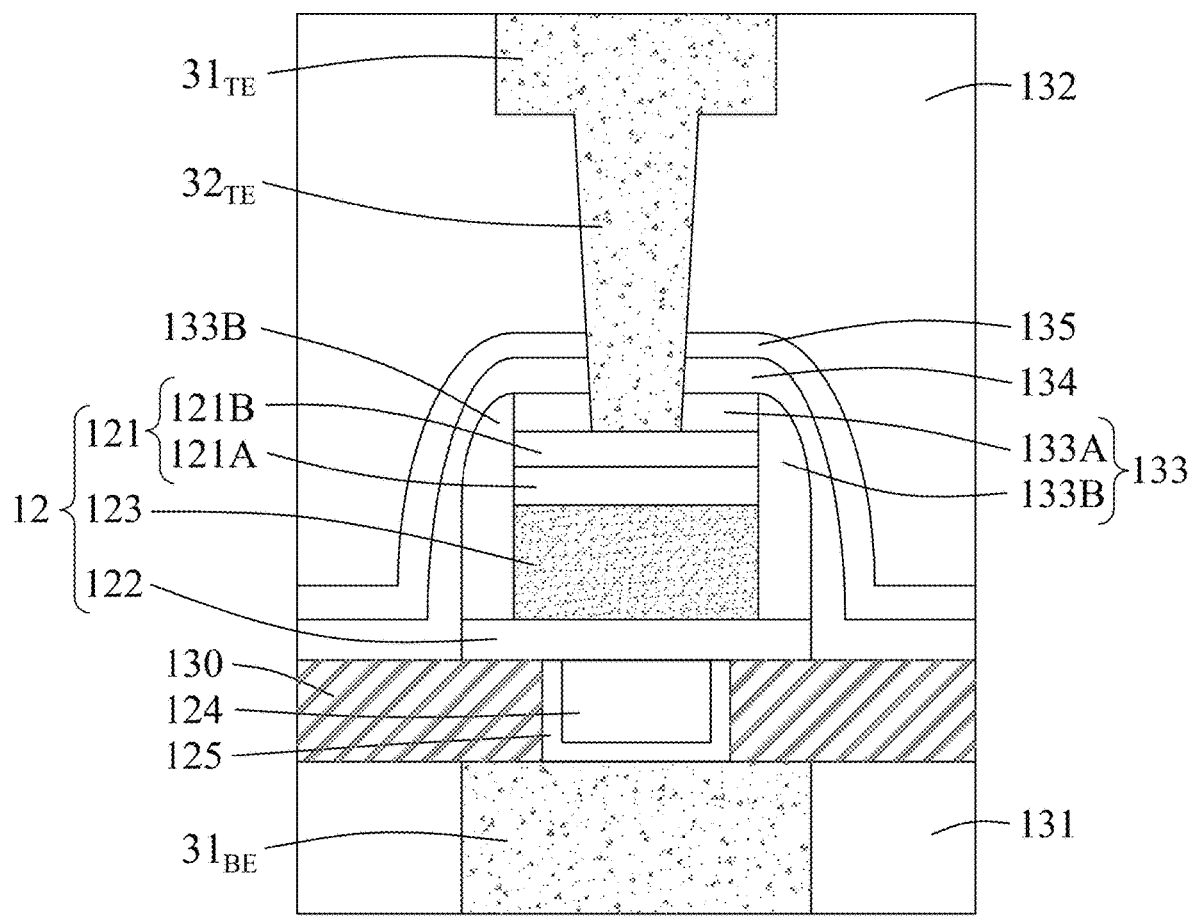
FIGS. 34 through 36 illustrate different variations of a structure of a ferroelectric capacitor in accordance with some embodiments.

FIG. 34 illustrates a first variation of the structure of the ferroelectric capacitor 12 in accordance with some embodiments. This variation shows a structure that differs from that in FIG. 3 in that, in FIG. 34, the first metal layer 121A and the second metal layer 121B have a width substantially the same as that of the ferroelectric structure 123.

Figure 35:
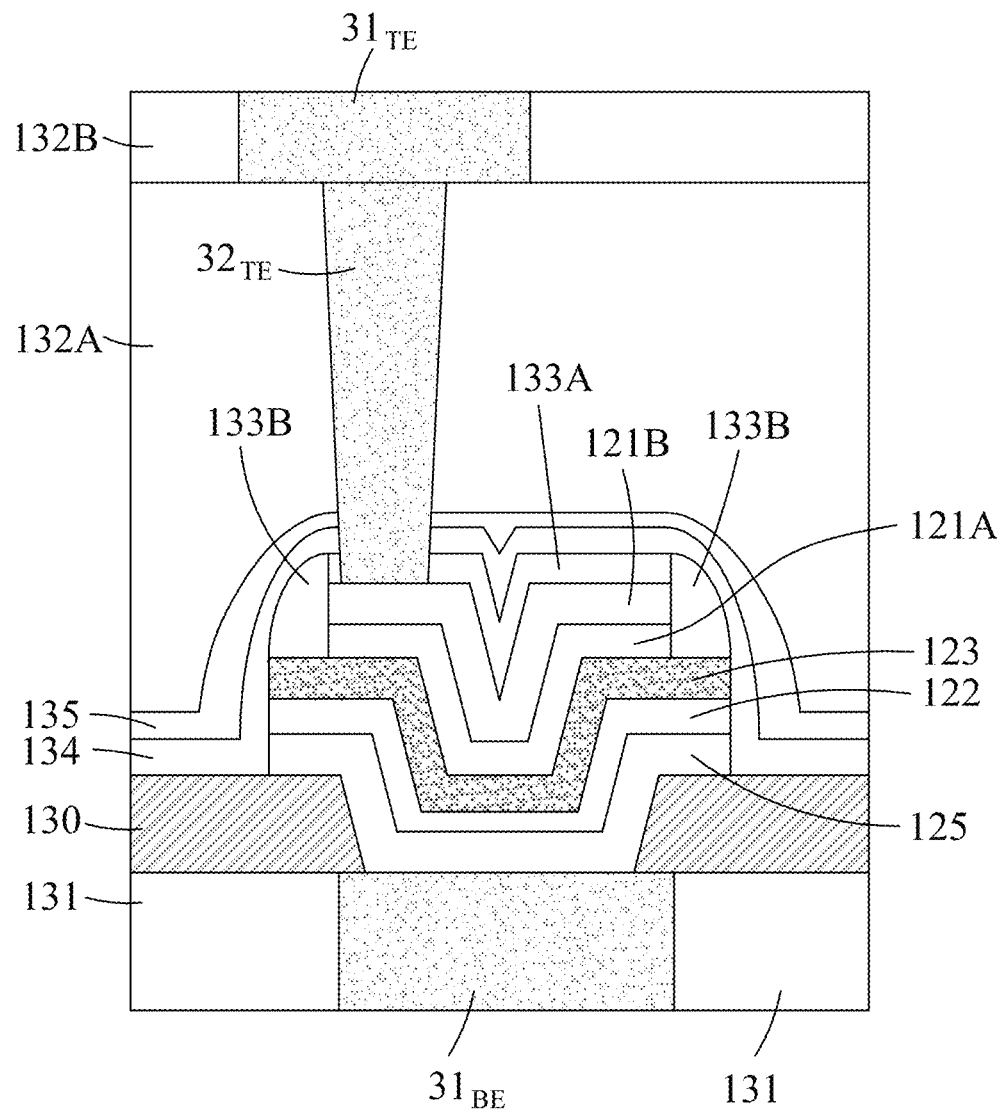

FIG. 35 illustrates a second variation of the structure of the ferroelectric capacitor 12 in accordance with some embodiments. This variation shows a structure that differs from that in FIG. 3 in that, in FIG. 35, the bottom electrode 122 is conformally formed on the buffer layer 125, so the top electrode 121, the bottom electrode 122 and the ferroelectric structure 123 have an indented central portion that corresponds in position to the trench formed in the via dielectric layer 130.

Figure 36:
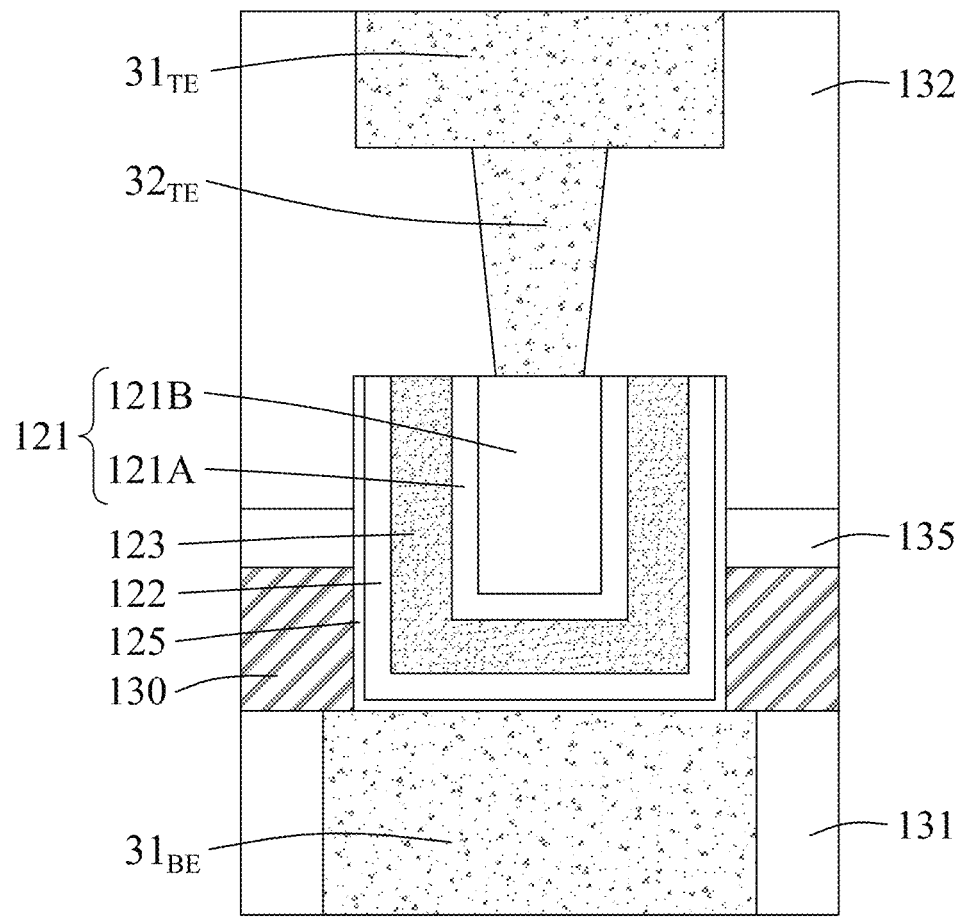

FIG. 36 illustrates a third variation of the structure of the ferroelectric capacitor 12 in accordance with some embodiments. This variation shows a structure that differs from that in FIG. 3 in that the ferroelectric capacitor 12 has a U-shaped bottom electrode 122, a U-shaped ferroelectric feature 123 conformally formed on the U-shaped bottom electrode 122, and a top electrode 121 filled in the U-shaped ferroelectric feature 123.

In summary, by properly applying voltage signals to a plurality of FeRAM cells at the same time to simultaneously induce wake-up effect in the FeRAM cells, time required to wake up all of the FeRAM cells can be reduced. The wake-up operation can be performed at wafer level or package level before the final product (e.g., packaged integrated circuit (IC) chips) is shipped out of the factory to customers, so the performance of the final product received by the customers can be improved.

In accordance with some embodiments, a method for waking up ferroelectric memory is proposed to include the following steps. In one step, a plurality of first signal lines, a plurality of second signal lines, a plurality of third signal lines, and a plurality of ferroelectric memory cells that constitute a ferroelectric memory array are formed on a wafer. Each of the ferroelectric memory cells is electrically connected to one of the first signal lines, one of the second signal lines and one of the third signal lines. In one step, voltage signals are simultaneously applied to the first signal lines, the second signal lines and the third signal lines to induce occurrence of a wake-up effect in the ferroelectric memory cells.

In accordance with some embodiments, each of the ferroelectric memory cells includes an access transistor and a ferroelectric capacitor/The access transistor includes multiple terminals, and the ferroelectric capacitor is electrically connected between one of the terminals of the access transistor, and one of the corresponding one of the first signal lines, the corresponding one of the second signal lines, and the corresponding one of the third signal lines.

In accordance with some embodiments, for each of the ferroelectric memory cells, the other two of the terminals of the access transistor are respectively connected to the other two of the corresponding one of the first signal lines, the corresponding one of the second signal lines, and the corresponding one of the third signal lines.

In accordance with some embodiments, the voltage signals are applied in such a way that a wake-up voltage signal across the ferroelectric capacitor of each of the ferroelectric memory cells has, at least in part, a voltage greater than a coercive voltage of the ferroelectric capacitor.

In accordance with some embodiments, the wake-up voltage signal has a positive voltage portion and a negative voltage portion. The positive voltage portion has, at least in part, a positive voltage of which a magnitude is greater than the coercive voltage of the ferroelectric capacitor. The negative voltage portion has, at least in part, a negative voltage of which a magnitude is greater than the coercive voltage of the ferroelectric capacitor.

In accordance with some embodiments, the positive voltage portion and the negative voltage portion are symmetric with respect to zero volts.

In accordance with some embodiments, for each of the ferroelectric memory cells, the ferroelectric capacitor includes a first capacitor electrode, a second capacitor electrode and a ferroelectric structure disposed between the first capacitor electrode and the second capacitor electrode, and the positive voltage portion and the negative voltage portion of the wake-up voltage signal are asymmetric with respect to zero volts to compensate for a difference between work functions of the first capacitor electrode and the second capacitor electrode.

In accordance with some embodiments, the wake-up voltage signal is a periodic voltage signal that has a frequency in a range from 100 Hz to 100 MHz.

In accordance with some embodiments, the wake-up voltage signal includes at least two consecutive pulses of which a time interval therebetween is in a range fro m 10 ns to 10 ms.

In accordance with some embodiments, the wake-up voltage signal includes at least two pulses, one of which has a wider pulse width and a smaller voltage magnitude than the other one of the at least two pulses.

In accordance with some embodiments, the method further includes the following steps. In one step, the wafer is cut into a plurality of dies. In one step, the dies are packaged into a plurality of chips. In one step, the chips are shipped out to a customer. The step of simultaneously applying voltage signals is performed before the step of shipping out the chips.

In accordance with some embodiments, the step of simultaneously applying voltage signals is performed before the step of cutting the wafers.

In accordance with some embodiments, the step of simultaneously applying voltage signals is performed after the step of packaging the dies.

In accordance with some embodiments, a method for waking up ferroelectric memory is proposed to include the following steps. In one step, a plurality of ferroelectric memory cells that cooperatively form a ferroelectric memory array are formed on a wafer. Each of the ferroelectric memory cells includes an access transistor and a ferroelectric capacitor. The access transistor has a first terminal, a second terminal and a third terminal, and the ferroelectric capacitor has a first capacitor electrode electrically connected to the third terminal of the access transistor, a second capacitor electrode, and a ferroelectric structure disposed between the first capacitor electrode and the second capacitor electrode. In one step, a first voltage is simultaneously applied to the first terminal and the second terminal of the access transistor of each of the ferroelectric memory cells in the ferroelectric memory array, and a second voltage is simultaneously applied to the second capacitor electrode of the ferroelectric capacitor of each of the ferroelectric memory cells in the ferroelectric memory array. The first voltage and the second voltage are applied simultaneously, and a difference between the first voltage and the second voltage is greater than a coercive voltage of the ferroelectric capacitor.

In accordance with some embodiments, the first voltage is constant, and the second voltage is a part of a wake-up voltage signal that has a positive voltage portion and a negative voltage portion. The positive voltage portion has, at least in part, a positive voltage of which a magnitude relative to the first voltage is greater than the coercive voltage of the ferroelectric capacitor, and the negative voltage portion has, at least in part, a negative voltage of which a magnitude relative to the first voltage is greater than the coercive voltage of the ferroelectric capacitor.

In accordance with some embodiments, the positive voltage portion and the negative voltage portion are symmetric with respect to the first voltage.

In accordance with some embodiments, the positive voltage portion and the negative voltage portion of the wake-up voltage signal are asymmetric with respect to the first voltage to compensate for a difference between work functions of the first capacitor electrode and the second capacitor electrode.

In accordance with some embodiments, a method for waking up ferroelectric memory is proposed to include the following steps. In one step, a plurality of ferroelectric memory cells that cooperatively form a ferroelectric memory array are formed on a wafer. Each of the ferroelectric memory cells includes an access transistor and a ferroelectric capacitor. The access transistor has a first terminal, a second terminal and a control terminal, and the ferroelectric capacitor has a first capacitor electrode electrically connected to the second terminal of the access transistor, a second capacitor electrode, and a ferroelectric structure disposed between the first capacitor electrode and the second capacitor electrode. In one step, a turn-on voltage is simultaneously applied to the control terminal of the access transistor of each of the ferroelectric memory cells in the ferroelectric memory array to make the access transistors conduct, a first voltage is simultaneously applied to the first terminal of the access transistor of each of the ferroelectric memory cells in the ferroelectric memory array, and a second voltage is simultaneously applied to the second capacitor electrode of the ferroelectric capacitor of each of the ferroelectric memory cells in the ferroelectric memory array. The turn-on voltage, the first voltage and the second voltage are applied simultaneously, and a difference between the first voltage and the second voltage is greater than a coercive voltage of the ferroelectric capacitor.

In accordance with some embodiments, one of the first voltage and the second voltage has a constant voltage level, and the other one of the first voltage and the second voltage is a part of a wake-up voltage signal that has a positive voltage portion and a negative voltage portion. The positive voltage portion has, at least in part, a positive voltage of which a magnitude relative to the constant voltage level is greater than the coercive voltage of the ferroelectric capacitor, and the negative voltage portion has, at least in part, a negative voltage of which a magnitude relative to the constant voltage level is greater than the coercive voltage of the ferroelectric capacitor.

In accordance with some embodiments, the positive voltage portion and the negative voltage portion are symmetric with respect to the constant voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for waking up ferroelectric memory, comprising steps of:
forming on a wafer a plurality of first signal lines, a plurality of second signal lines, a plurality of third signal lines, and a plurality of ferroelectric memory cells that constitute a ferroelectric memory array, wherein each of the ferroelectric memory cells is electrically connected to one of the first signal lines, one of the second signal lines and one of the third signal lines; and simultaneously applying voltage signals to all of the first signal lines, all of the second signal lines and all of the third signal lines to induce occurrence of a wake-up effect in all of the ferroelectric memory cells simultaneously;

wherein each of the ferroelectric memory cells includes a ferroelectric capacitor that has a first capacitor electrode, a second capacitor electrode and a ferroelectric structure disposed between the first capacitor electrode and the second capacitor electrode;

wherein the voltage signals are applied in such a way that a wake-up voltage signal across the ferroelectric capacitor of each of the ferroelectric memory cells has a positive voltage portion and a negative voltage portion that are asymmetric with respect to zero volts; and wherein the asymmetry between the positive voltage portion and the negative voltage portion is configured based on a difference between work functions of the first capacitor electrode and the second capacitor electrode in such a way that the difference between work functions of the first capacitor electrode and the second capacitor electrode is compensated for by the asymmetry between the positive voltage portion and the negative voltage portion.

2. The method according to claim 1, wherein each of the ferroelectric memory cells further includes an access transistor that includes multiple terminals, and the ferroelectric capacitor is electrically connected between one of the terminals of the access transistor, and one of the corresponding one of the first signal lines, the corresponding one of the second signal lines, and the corresponding one of the third signal lines.

3. The method according to claim 2, wherein, for each of the ferroelectric memory cells, the other two of the terminals of the access transistor are respectively connected to the other two of the corresponding one of the first signal lines, the corresponding one of the second signal lines, and the corresponding one of the third signal lines.

4. The method according to claim 2, wherein the wake-up voltage signal across the ferroelectric capacitor of each of the ferroelectric memory cells has, at least in part, a voltage greater than a coercive voltage of the ferroelectric capacitor.

5. The method according to claim 4, wherein the positive voltage portion of the wake-up voltage signal has, at least in part, a positive voltage of which a magnitude is greater than the coercive voltage of the ferroelectric capacitor, and the negative voltage portion of the wake-up voltage signal has, at least in part, a negative voltage of which a magnitude is greater than the coercive voltage of the ferroelectric capacitor.

6. The method according to claim 1, wherein the wake-up voltage signal is a periodic voltage signal that has a frequency in a range from 100 Hz to 100 MHz.

7. The method according to claim 1, wherein the wake-up voltage signal includes at least two consecutive pulses of which a time interval therebetween is in a range from 10 ns to 10 ms.

8. The method according to claim 1, wherein the wake-up voltage signal includes at least two pulses, one of which has a wider pulse width and a smaller voltage magnitude than the other one of the at least two pulses.

9. The method according to claim 1, further comprising steps of:

cutting the wafer into a plurality of dies;
packaging the dies into a plurality of chips; and
shipping out the chips to a customer;
wherein the step of simultaneously applying voltage signals is performed before the step of shipping out the chips.

10. The method according to claim 9, wherein the step of simultaneously applying voltage signals is performed before the step of cutting the wafers.

11. The method according to claim 9, wherein the step of simultaneously applying voltage signals is performed after the step of packaging the dies.

12. A method for waking up ferroelectric memory, comprising steps of:

forming on a wafer a plurality of ferroelectric memory cells that cooperatively form a ferroelectric memory array, each of the ferroelectric memory cells including an access transistor and a ferroelectric capacitor; and simultaneously applying a wake-up voltage signal to the ferroelectric capacitors of all of the ferroelectric memory cells in the ferroelectric memory array;

wherein the wake-up voltage signal includes at least two pulses each having a voltage greater than a coercive voltage of the ferroelectric capacitor;

wherein one of the at least two pulses has a wider pulse width and a smaller voltage magnitude than the other one of the at least two pulses, wherein, for each of the ferroelectric memory cells, the access transistor has a first terminal, a second terminal and a third terminal, and the ferroelectric capacitor has a first capacitor electrode electrically connected to the third terminal of the access transistor, a second capacitor electrode, and a ferroelectric structure disposed between the first capacitor electrode and the second capacitor electrode;

wherein the step of simultaneously applying the wake-up voltage signal includes:

simultaneously applying a first voltage to the first terminal and the second terminal of the access transistor of each of the ferroelectric memory cells in the ferroelectric memory array, and simultaneously applying a second voltage to the second capacitor electrode of the ferroelectric capacitor of each of the ferroelectric memory cells in the ferroelectric memory array;

wherein the first voltage is constant, and the second voltage has a positive voltage portion and a negative voltage portion;

wherein the positive voltage portion has, at least in part, a positive voltage of which a magnitude relative to the first voltage is greater than the coercive voltage of the ferroelectric capacitor, and the negative voltage portion has, at least in part, a negative voltage of which a magnitude relative to the first voltage is greater than the coercive voltage of the ferroelectric capacitor;

wherein the positive voltage portion and the negative voltage portion of the wake-up voltage signal are asymmetric with respect to the first voltage; and wherein the asymmetry between the positive voltage portion and the negative voltage portion is configured based on a difference between work functions of the first capacitor electrode and the second capacitor electrode in such a way that the difference between work functions of the first capacitor electrode and the second capacitor electrode is compensated for by the asymmetry between the positive voltage portion and the negative voltage portion.

13. A method for waking up ferroelectric memory, comprising steps of:
- forming on a wafer a plurality of ferroelectric memory cells that cooperatively form a ferroelectric memory array, each of the ferroelectric memory cells including an access transistor and a ferroelectric capacitor, the ferroelectric capacitor having a first capacitor electrode, a second capacitor electrode and a ferroelectric structure disposed between the first capacitor electrode and the second capacitor electrode; and
- simultaneously applying a wake-up voltage signal to the ferroelectric capacitors of all of the ferroelectric memory cells in the ferroelectric memory array;
- wherein the wake-up voltage signal has a positive voltage portion and a negative voltage portion that are asymmetric with respect to zero volts;
- wherein each of the positive voltage portion and the negative voltage portion of the wake-up voltage signal generates an electric field in the ferroelectric structure, and the electric field is in a range from $2 \times 10^6$ volts/cm to $6 \times 10^6$ volts/cm; and
- wherein the asymmetry between the positive voltage portion and the negative voltage portion is configured based on a difference between work functions of the first capacitor electrode and the second capacitor electrode in such a way that the difference between work functions of the first capacitor electrode and the second capacitor electrode is compensated for by the asymmetry between the positive voltage portion and the negative voltage portion.

14. The method according to claim 13, wherein the positive voltage portion of the wake-up voltage signal has, at least in part, a positive voltage of which a magnitude relative to the constant voltage level is greater than a coercive voltage of the ferroelectric capacitor, and the negative voltage portion of the wake-up voltage signal has, at least in part, a negative voltage of which a magnitude relative to the constant voltage level is greater than the coercive voltage of the ferroelectric capacitor.

15. The method according to claim 14, wherein, for each of the ferroelectric memory cells, the access transistor has a first terminal, a second terminal that is electrically connected to the first capacitor electrode of the ferroelectric capacitor, and a control terminal;
- wherein the step of simultaneously applying a wake-up voltage signal includes:
  - simultaneously applying a turn-on voltage to the control terminal of the access transistor of each of the ferroelectric memory cells in the ferroelectric memory array to make the access transistors conduct, simultaneously applying a first voltage to the first terminal of the access transistor of each of the ferroelectric memory cells in the ferroelectric memory array, and simultaneously applying a second voltage to the second capacitor electrode of the ferroelectric capacitor of each of the ferroelectric memory cells in the ferroelectric memory array;
- wherein the turn-on voltage, the first voltage and the second voltage are applied simultaneously, and a difference between the first voltage and the second voltage is greater than a coercive voltage of the ferroelectric capacitor.

16. The method according to claim 15, wherein one of the first voltage and the second voltage has a constant voltage level.

17. The method according to claim 13, wherein the wake-up voltage signal includes at least two pulses each having a voltage greater than a coercive voltage of the ferroelectric capacitor; and
- wherein one of the at least two pulses has a wider pulse width and a smaller voltage magnitude than the other one of the at least two pulses.

18. The method according to claim 1, wherein each of the positive voltage portion and the negative voltage portion of the wake-up voltage signal generates an electric field in the ferroelectric structure, and the electric field is in a range from $2 \times 10^6$ volts/cm to $6 \times 10^6$ volts/cm.

19. The method according to claim 12, wherein each of the positive voltage portion and the negative voltage portion of the wake-up voltage signal generates an electric field in the ferroelectric structure, and the electric field is in a range from $2 \times 10^6$ volts/cm to $6 \times 10^6$ volts/cm.

20. The method according to claim 12, further comprising steps of:
- cutting the wafer into a plurality of dies;
- packaging the dies into a plurality of chips; and
- shipping out the chips to a customer,
- wherein the step of simultaneously applying a wake-up voltage signal is performed before the step of shipping out the chips.

* * * * *